(12) United States Patent
Kang

(10) Patent No.: US 9,153,294 B2
(45) Date of Patent: Oct. 6, 2015

(54) SEMICONDUCTOR MEMORY DEVICE HAVING ADJUSTABLE REFRESH PERIOD, MEMORY SYSTEM COMPRISING SAME, AND METHOD OF OPERATING SAME

(71) Applicant: SAMSUNG ELECTRONICS CO., LTD., Suwon-Si, Gyeonggi-Do (KR)

(72) Inventor: Uk-Song Kang, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 139 days.

(21) Appl. No.: 14/014,490

(22) Filed: Aug. 30, 2013

(65) Prior Publication Data

US 2014/0085999 A1 Mar. 27, 2014

(30) Foreign Application Priority Data

Sep. 24, 2012 (KR) .................. 10-2012-0105946

(51) Int. Cl.
| | |
|---|---|
| *G11C 11/401* | (2006.01) |
| *G11C 7/00* | (2006.01) |
| *G11C 11/406* | (2006.01) |
| *G11C 11/408* | (2006.01) |
| *G11C 29/02* | (2006.01) |
| *G11C 29/50* | (2006.01) |
| *G06F 12/00* | (2006.01) |
| *G11C 11/4076* | (2006.01) |
| *G11C 5/04* | (2006.01) |

(52) U.S. Cl.
CPC .............. *G11C 7/00* (2013.01); *G11C 11/408* (2013.01); *G11C 11/4087* (2013.01); *G11C 11/40611* (2013.01); *G11C 11/40615* (2013.01); *G11C 11/40622* (2013.01); *G11C 29/023* (2013.01); *G11C 29/028* (2013.01); *G11C 29/50016* (2013.01); *G11C 5/04* (2013.01); *G11C 11/4076* (2013.01); *G11C 2211/4065* (2013.01); *G11C 2211/4068* (2013.01)

(58) Field of Classification Search
CPC ........... G11C 11/40618; G11C 11/401; G11C 11/406; G11C 7/00
USPC ......................................... 365/222; 711/106
See application file for complete search history.

(56) References Cited

U.S. PATENT DOCUMENTS

| | | |
|---|---|---|
| 6,166,980 A | 12/2000 | Chun |
| 6,819,589 B1 | 11/2004 | Aakjer |

(Continued)

FOREIGN PATENT DOCUMENTS

| | | |
|---|---|---|
| JP | 2004-355793 | 12/2004 |
| KR | 0317195 | 11/2001 |

(Continued)

*Primary Examiner* — Christopher Shin
(74) *Attorney, Agent, or Firm* — Volentine & Whitt, PLLC

(57) ABSTRACT

A semiconductor memory device includes a cell array including a plurality of cell regions, a row decoder configured to drive rows corresponding to cell regions in which a refresh operation is to be performed, based on a counting address, and a refresh address generator configured to generate the counting address and a modified address in response to a control signal, wherein the modified address is generated by inverting at least one bit of the counting address, and wherein the semiconductor memory device performs concurrent refresh operations on a first cell region corresponding to the counting address and a second cell region corresponding to the modified address where the second cell region is determined to have weak cells.

18 Claims, 19 Drawing Sheets

(56) References Cited

U.S. PATENT DOCUMENTS

| | | | |
|---|---|---|---|
| 7,099,221 B2* | 8/2006 | Klein | 365/222 |
| 7,623,392 B2 | 11/2009 | Klein | |
| 7,701,795 B2 | 4/2010 | Lee et al. | |
| 2006/0056260 A1* | 3/2006 | Klein | 365/222 |
| 2007/0297260 A1 | 12/2007 | Lee et al. | |
| 2008/0151671 A1 | 6/2008 | Klein | |
| 2013/0279284 A1* | 10/2013 | Jeong | 365/222 |
| 2014/0181613 A1* | 6/2014 | Klein | 714/754 |

FOREIGN PATENT DOCUMENTS

| | | |
|---|---|---|
| KR | 0443791 | 7/2004 |
| KR | 2007-0078934 | 8/2007 |
| KR | 2007-0119838 | 12/2007 |
| KR | 2012-0035052 | 4/2012 |
| WO | 2004-021359 A2 | 3/2004 |

* cited by examiner

SEMICONDUCTOR MEMORY DEVICE HAVING ADJUSTABLE REFRESH PERIOD, MEMORY SYSTEM COMPRISING SAME, AND METHOD OF OPERATING SAME

CROSS-REFERENCE TO RELATED APPLICATIONS

This application claims priority under 35 U.S.C. §119 to Korean Patent Application No. 10-2012-0105946 filed on Sep. 24, 2012, the disclosure of which is hereby incorporated by reference.

BACKGROUND OF THE INVENTION

The inventive concept relates generally to electronic memory technologies. More particularly, certain embodiments of the inventive concept relate to semiconductor memory devices having an adjustable refresh period.

Certain types of memory devices require refresh operations to retain stored data. An example of such a memory device is a dynamic random access memory (DRAM), which stores data by maintaining charges in a capacitor. The charges tend to leak over time, so refresh operations are performed to compensate for this leakage. The refresh operation is typically performed on a periodic basis, with the period determined by the expected rate of charge leakage.

In some contexts, the rate of charge leakage may vary significantly between different memory cells, with so-called "weak cells" requiring more frequent refreshing due to a higher rate of leakage. In these contexts, if the refresh period is too long, the weak cells may lose stored data. On the other hand, if the refresh period is shorter, power consumption will be higher. Accordingly, there is a general tradeoff between the reliability of weak cells and overall power consumption in a DRAM.

SUMMARY OF THE INVENTION

In one embodiment of the inventive concept, a semiconductor memory device comprises a cell array comprising a plurality of cell regions, a row decoder configured to drive rows corresponding to cell regions in which a refresh operation is to be performed, based on a counting address, and a refresh address generator configured to generate the counting address and a modified address in response to a control signal, wherein the modified address is generated by inverting at least one bit of the counting address, and wherein the semiconductor memory device performs concurrent refresh operations on a first cell region corresponding to the counting address and a second cell region corresponding to the modified address where the second cell region is determined to have weak cells.

In another embodiment of the inventive concept, a memory system comprises a memory controller configured to control a refresh operation of a cell array. The memory controller comprises a weak address storing unit storing addresses of weak cell regions of the cell array, an address counter configured to generate a reference address indicating a cell region to be refreshed, and a comparator configured to compare a modified address derived from the reference address with the addresses of the weak cell regions and to output a matching signal according to a result of comparison.

In yet another embodiment of the inventive concept, a method of operating a semiconductor device comprises generating a refresh address corresponding to a first cell region to be refreshed, generating a modified address by inverting at least one bit of the refresh address, the modified address corresponding to a second cell region different from the first cell region, determining whether the second cell region comprises weak cells, and upon determining that the second cell region comprises weak cells, performing concurrent refresh operations on the first and second cell regions.

These and other embodiments of the inventive concept can provide potential improvements in data reliability and/or power consumption of memory devices requiring refresh operations.

BRIEF DESCRIPTION OF THE DRAWINGS

The drawings illustrate selected embodiments of the inventive concept. In the drawings, like reference numbers indicate like features.

DETAILED DESCRIPTION

Selected embodiments of the inventive concept are described below with reference to the accompanying drawings. These embodiments are presented as teaching examples and should not be construed to limit the scope of the inventive concept.

In the description that follows, the terms used to describe various embodiments are illustrative and are not intended to limit the scope of the inventive concept. Terms in singular form may encompass the plural form as well, unless otherwise defined. Terms such as "comprise", "comprising", "include", "including", etc., indicate the presence of mentioned features, and do not exclude the existence of additional features. As used herein, the term "and/or" includes any one of at least one of combinations of one or more of the associated listed items. As used herein, the term "and/or" includes any and all combinations of one or more of the associated listed items. Expressions such as "at least one of" where preceding a list of elements, modify the entire list of elements and do not modify the individual elements of the list. Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In certain embodiments described below, a memory device stores information regarding addresses of weak cells, and it selectively adjusts a refresh frequency according to the information. For example, it may increase the refresh frequency of the weak cells to prevent them from losing information.

Figure 1:
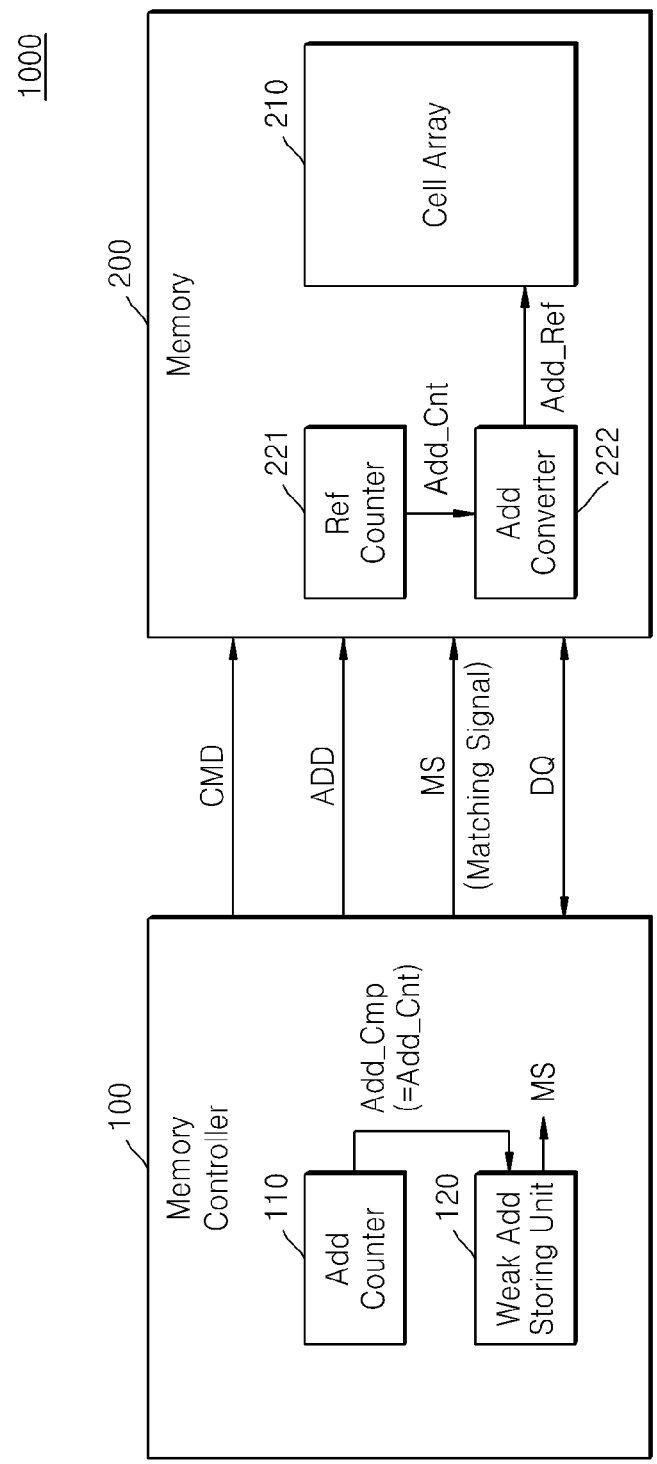
FIG. 1 is a block diagram of a memory system according to an embodiment of the inventive concept.

FIG. 1 is a block diagram of a memory system 1000 comprising a semiconductor memory device 200 according to an embodiment of the inventive concept.

Referring to FIG. 1, memory system 1000 comprises a memory controller 100 and semiconductor memory device 200. Memory controller 100 generates various signals for controlling semiconductor memory device 200, such as, commands/addresses CMD/ADD. Semiconductor memory device 200 stores a data signal DQ received from a cell array 210 or supplies data signal DQ stored in cell array 210 based on signals CMD/ADD received from memory controller 100. Semiconductor memory device 200 may be, for instance, a DRAM chip comprising a cell array in which DRAM cells are disposed in the form of an array. In the following description, it is assumed that semiconductor memory device 200 is a DRAM chip.

Memory controller 100 supplies a control signal for controlling a refresh operation of semiconductor memory device 200. In the described examples, this control signal is a matching signal MS. Semiconductor memory device 200 refreshes one cell region or at least two cell regions based on matching signal MS.

Memory controller 100 comprises an address counter 110 and a weak address storing unit 120 used to control the refresh operation of semiconductor memory device 200. Address counter 110 generates a reference address Add_Cmp with a sequentially changing (e.g., increasing) value. Reference address Add_Cmp may be the same as a counting address Add_Cnt indicating cell regions to be refreshed in semiconductor memory device 200. Weak address storing unit 120 stores addresses of "weak cell regions", i.e., those having relatively low data retention characteristics, from among a plurality of cell regions of cell array 210 of semiconductor memory device 200.

Memory controller 100 generates matching signal MS based on reference address Add_Cmp generated by address counter 110 and the addresses of the weak cell regions stored in weak address storing unit 120. Memory controller 100 compares reference address Add_Cmp with the addresses of the weak cell regions or with a modified version of those addresses. The modified version of an address can be generated, for instance, by changing at least one bit (e.g., a most significant bit (MSB)) in one of the addresses of the weak cell regions. Upon determining that reference address Add_Cmp matches one of the address of the weak cell regions (i.e., a "weak address"), memory controller 100 outputs a matching signal MS having a second logic state (e.g., logic "high"). If it is determined that two addresses match each other as a result of comparing the address that is generated by inverting at least one bit of the weak address with reference address Add_Cmp, matching signal MS is output with the second logic state. In this case, as described above, because reference address Add_Cmp is the same as counting address Add_Cnt that is generated by semiconductor memory device 200, if the weak address corresponding to the address that is generated by inverting at least one bit of counting address Add_Cnt is present or the address that is generated by inverting at least one bit of the weak address is the same as counting address Add_Cnt, matching signal MS may have the second logic state.

Semiconductor memory device 200 comprises cell array 210 comprising a plurality of memory cells, a refresh counter 221, and an address converter 222, which are circuits for performing refresh operations. Semiconductor memory device 200 refreshes the memory cells in cell array 210 for one refresh period. Cell array 210 comprises a plurality of cell regions, and each of the cell regions may be, for example, a page designated by a row address.

Where refreshing the cell regions of cell array 210, refresh counter 221 generates a counting address Add_Cnt designating the cell regions of cell array 220 sequentially for one refresh period. In this case, refresh counter 221 may be initialized at the same time as address counter 110 of memory controller 100, and may count addresses based on the same signal as that of address counter 110, thereby operating in synchronization with address counter 110. Thus, counting address Add_Cnt generated by refresh counter 221 and reference address Add_Cmp generated by address counter 110 may be the same.

Address converter 222 generates a refresh address Add_Ref designating a cell region to be refreshed, based on matching signal MS and counting address Add_Cnt. If the received matching signal MS is in a first logic state (e.g., logic "low"), address converter 222 does not convert counting address Add_Cnt but outputs counting address Add_Ref as a refresh address Add_Ref. Otherwise, if the received matching signal MS is in a second logic state (e.g., logic "high"), address converter 222 converts at least one bit of counting address Add_Cnt and outputs refresh address Add_Ref designating at least two cell regions. For example, address converter 222 may convert at least one bit (e.g., an MSB) of the counting address Add_Cnt into a do-not-care bit (hereinafter, "do-not-care" processing) and may output the converted address Add_Cnt as refresh address Add_Ref. In this case, refresh address Add_Ref comprises both counting address Add_Cnt and an address that is generated by inverting at least one bit of counting address Add_Cnt (hereinafter, a "bit inverting address"). The bit inverting address may be one of the weak addresses stored in weak address storing unit 120 of memory controller 100. Thus, the cell regions that correspond to counting address Add_Cnt and the bit inverting address, i.e., the weak address may be concurrently refreshed.

In the embodiment illustrated in FIG. 1, the cell regions corresponding to the counting address are refreshed in sequence. If an address that is generated by inverting at least one bit of the counting address (i.e., a modified address) is one of the weak addresses, a cell region corresponding to the counting address and a cell region corresponding to the modified address are refreshed together. Thus, for one refresh period, a refresh frequency of weak cells is selectively increased so that a consumed current for performing refresh may not be greatly increased and data stored in the weak cells may be stably retained.

Memory system 1000 illustrated in FIG. 1 stores the weak addresses in memory controller 100 (not in semiconductor memory device 200) to avoid an increase in the size of a chip of semiconductor memory device 200. Also, semiconductor memory device 200 performs refresh based on counting address Add_Cnt generated by refresh counter 221 that is separated from memory controller 100, and if semiconductor memory device 200 receives matching signal MS, semiconductor memory device 200 refreshes two cell regions concurrently. Thus, an additional address for refresh and an additional refresh command do not need to be supplied from memory controller 100 so that the entire performance of memory system 1000 may be improved.

Figure 2:
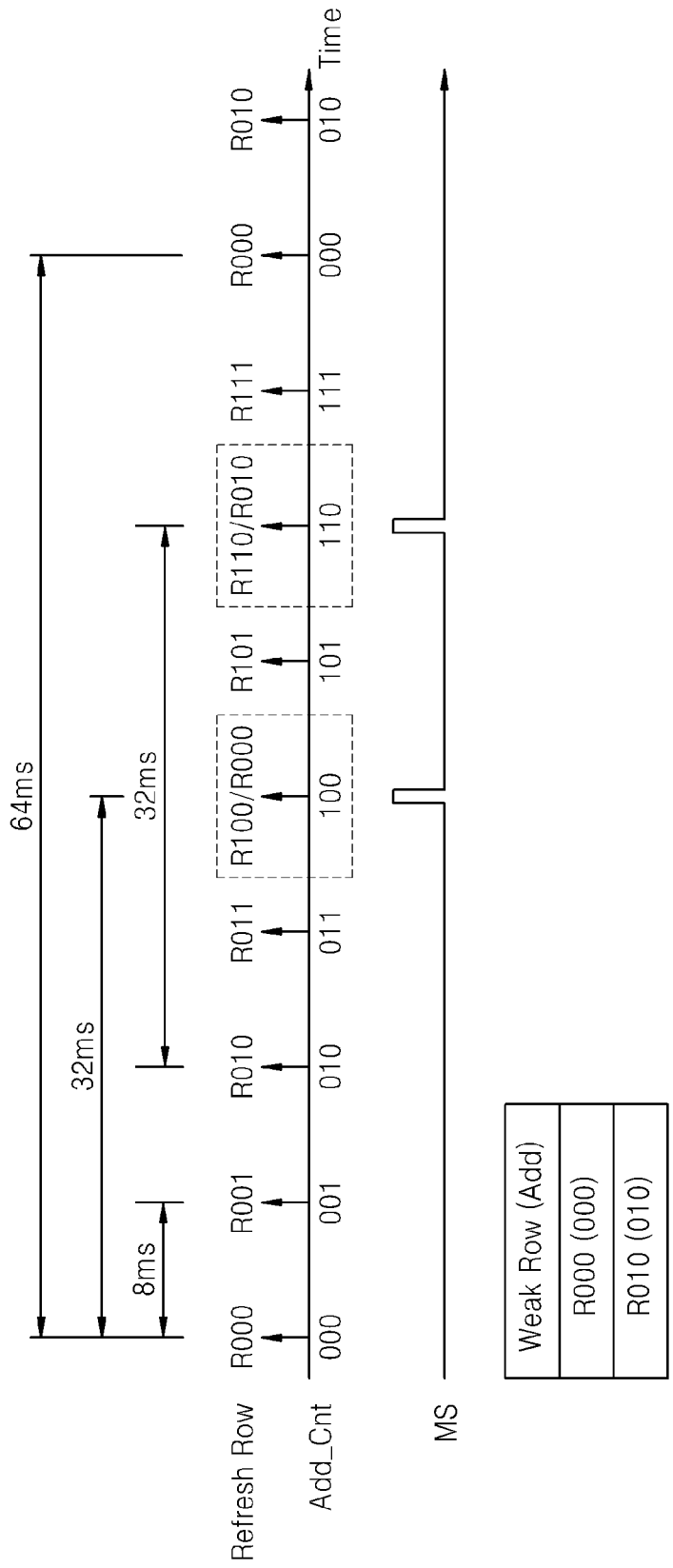
FIG. 2 is a timing diagram illustrating an example of a refresh operation of the memory system of FIG. 1.

FIG. 2 illustrates an example of a refresh operation of memory system 1000 of FIG. 1. For convenience of explanation, cell array 210 of semiconductor memory device 200 of FIG. 1 is illustrated with eight rows R000 to R111 comprising a plurality of cells, and it is assumed that, among them, weak rows comprising weak cells having relative low data retention characteristics are R000 and R010. In this case, a data retention time of rows comprising normal cells (hereinafter, "normal rows") is 64 milliseconds (ms) or more, and a data retention time of weak rows is between 32 ms and 64 ms. It is assumed that, if at least one of the weak addresses stored in weak address storing unit 120 has the same value as a value that is obtained by inverting the MSB of reference address Add_Cmp, memory controller 100 of FIG. 1 outputs matching signal MS having a second logic state (e.g., logic high).

Because the data retention time of the normal rows is 64 ms or more, entire rows should be refreshed in a refresh period of 64 ms. Because the data retention time of the weak rows is between 32 ms and 64 ms, the weak rows should be refreshed in a period of 32 ms.

Address counter 210 in memory controller 100 of FIG. 1 and refresh counter 221 in semiconductor memory device 200 may be initialized at the same initialization value, and addresses from 000 to 111 may be sequentially counted according to refresh commands. The address that is generated by inverting the MSB of the addresses does not correspond to an address of the weak rows until counting addresses Add_Cnt are counted from 000 to 011. Thus, matching signal MS is maintained in a first logic state (e.g., logic low). On the other hand, if counting address Add_Cnt is 100, because the value that is obtained by inverting the MSB of addresses is 000 and corresponds to the weak address, matching signal MS is in a second logic state (e.g., logic high). In this case, semiconductor memory device 200 of FIG. 1 do-not-care processes MSB of 100 that is counting address Add_Cnt in response to matching signal MS. Thus, rows R100 and R000 that correspond to addresses 100 and 000 may be refreshed.

Similarly, where counting address Add_Cnt is 110, because the value that is obtained by inverting the MSB of address is 010 and corresponds to the weak address, matching signal MS is in a second logic state, and semiconductor memory device 200 responds to matching signal MS and do-not-care processes MSB of 110 that is counting address Add_Cnt. Thus, rows R110 and R010 that correspond to addresses 110 and 010 may be refreshed. As a result, normal rows R001 and R011 to R111 may be refreshed in every period of 64 ms, and weak rows R000 and R010 may be refreshed in every period of 32 ms.

Figure 3A:
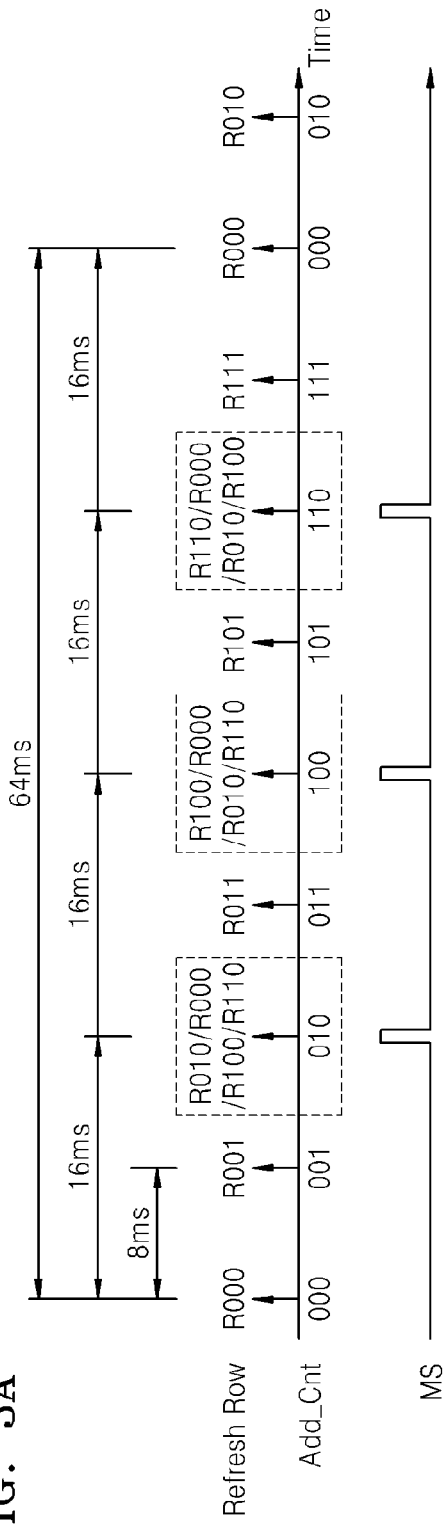
FIG. 3A is a timing diagram illustrating another example of a refresh operation of the memory system of FIG. 1.
Figure 3B:
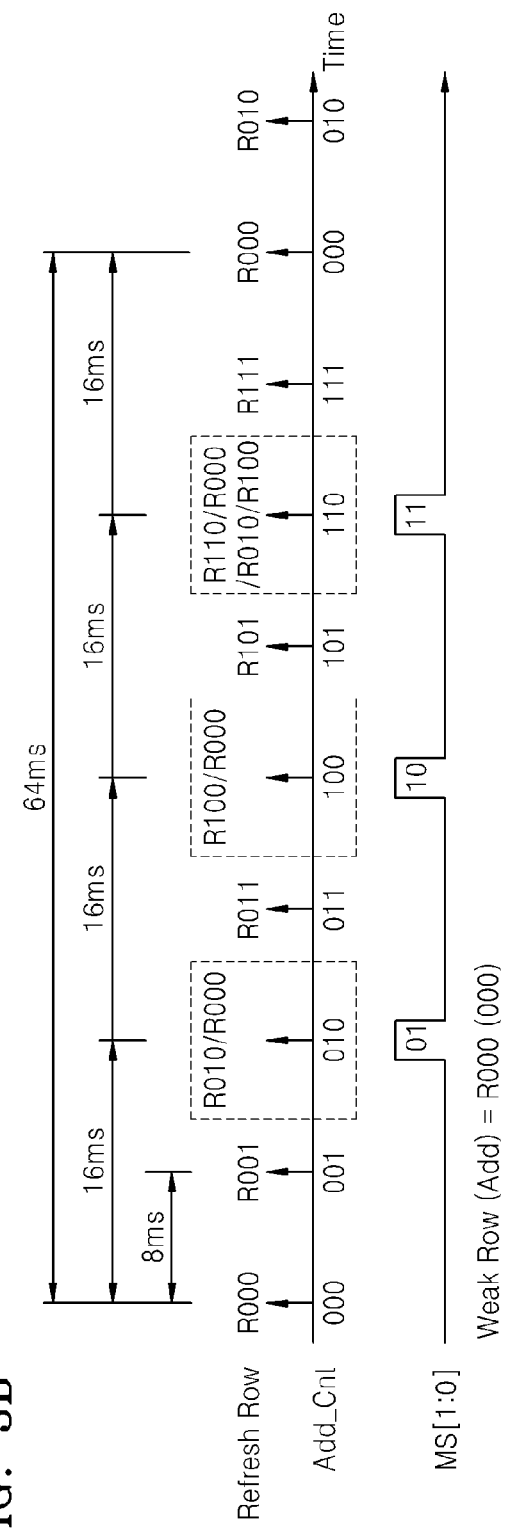
FIG. 3B is a timing diagram illustrating another example of a refresh operation of the memory system of FIG. 1.

FIGS. 3A and 3B illustrate another example of a refresh operation of memory system 1000 of FIG. 1. In particular, FIGS. 3A and 3B illustrate a refresh operation where a value obtained by inverting at least one bit of two upper bits of counting address Add_Cnt corresponds to a weak address. FIG. 3A illustrates a refresh operation where one bit of matching signal MS is generated, and FIG. 3B illustrates a refresh operation where two bits of matching signals MS[1:0] are generated. For convenience of explanation, cell array 21 of semiconductor memory device 200 of FIG. 1 comprises eight rows R000 to R111 comprising a plurality of cells, and it is assumed that, among those cells, a weak row comprising weak cells having relatively low data retention characteristics is R000. In this case, it is assumed that a data retention time of rows comprising normal cells is 64 ms or more and a data retention time of the weak row is between 16 ms and 32 ms. In this case, the entire rows should be refreshed in a refresh period of 64 ms, and weak rows should be refreshed in a period of 16 ms. Thus, the weak rows should be refreshed at least four times for the entire refresh period. To this end, if a value that is obtained by inverting at least one of the upper two bits of reference address Add_Cmp having the same value as that of counting address Add_Cnt corresponds to the weak address, memory controller 100 of FIG. 1 may generate an enabled matching signal MS. Because the weak address is 000, where counting address Add_Ref is 010, 100, and 110, the enabled matching signal MS may be generated.

As illustrated in FIG. 3A, matching signal MS that is a one-bit signal may have one of the first logic state (e.g., logic low) and the second logic state (e.g., logic high). Semiconductor memory device 200 do-not-care processes the upper two bits of counting address Add_Cnt and refreshes rows corresponding to the converted counting address Add_Cnt. Thus, if counting address Add_Cnt is 010, rows R010, R000, R100, and R110 that correspond to addresses 010, 000, 100, and 110 are refreshed, and if counting address Add_Cnt is 100, rows R100, R000, R010, and R110 that correspond to addresses 100, 000, 010, and 110 are refreshed. If counting address Add_Cnt is 110, rows R110, R100, R010, and R000 that correspond to addresses 110, 100, 010, and 000 are refreshed. As a result, the entire refresh period is 64 ms, and a weak row R000 may be refreshed in every period of 16 ms.

As illustrated in FIG. 3B, a matching signal MS[1:0] may be a two-bit signal, and it may indicate whether a value obtained by inverting at least one of the upper two bits of counting address Add_Cnt corresponds to a weak address and may concurrently indicate which bit of counting address Add_Cnt that is inverted corresponds to the weak address. For example, MS[1] may indicate whether a value that is obtained by inverting the MSB of counting address Add_Cnt corresponds to the weak address, and MS[0] may indicate whether a value that is obtained by the former bit of the MSB, for example, a second bit of counting address Add_Cnt in the present embodiment corresponds to the weak address. Semiconductor memory device 200 of FIG. 1 do-not-care processes corresponding bits of counting address Add_Cnt according to a value of matching signal MS[1:0].

As illustrated in FIG. 3B, if counting Add_Cnt is 010, a value that is obtained by inverting the second bit of counting address Add_Cnt is 000 and corresponds to the weak address. Thus, matching signal MS[1:0] is 01, and the second bit of counting address Add_Cnt is do-not-care processed, and rows R010 and R000 that correspond to addresses 010 and 000 are refreshed. If counting address Add_Cnt is 100, a value that is obtained by inverting the MSB of counting address Add_Cnt is 000 and corresponds to the weak address. Thus, matching signal MS[1:0] is 10, and the MSB of the counting address is do-not-care processed, and rows R100 and R000 that correspond to addresses 100 and 000 are refreshed. If counting address Add_Cnt is 110, a value that is obtained by inverting the MSB and the second bit of counting address Add_Cnt is 000 and corresponds to the weak address. Thus, matching signal MS[1:0] is 11, and the MSB and the second bit of counting address Add_Cnt is do-not-care processed, and rows R110, R010, R100, and R000 that correspond to address 110, 010, 100, and 000 are refreshed. As a result, the entire refresh period is 64 ms, and weak row R000 may be refreshed in every period of 16 ms.

Figure 4A:
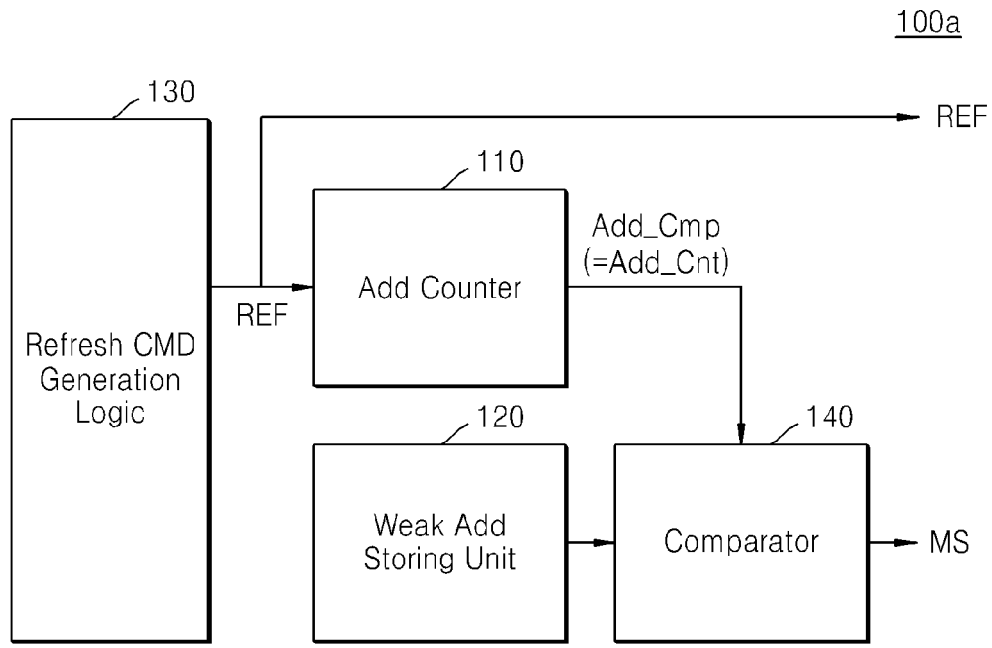
FIG. 4A is a block diagram illustrating an example of a memory controller illustrated in FIG. 1.
Figure 4B:
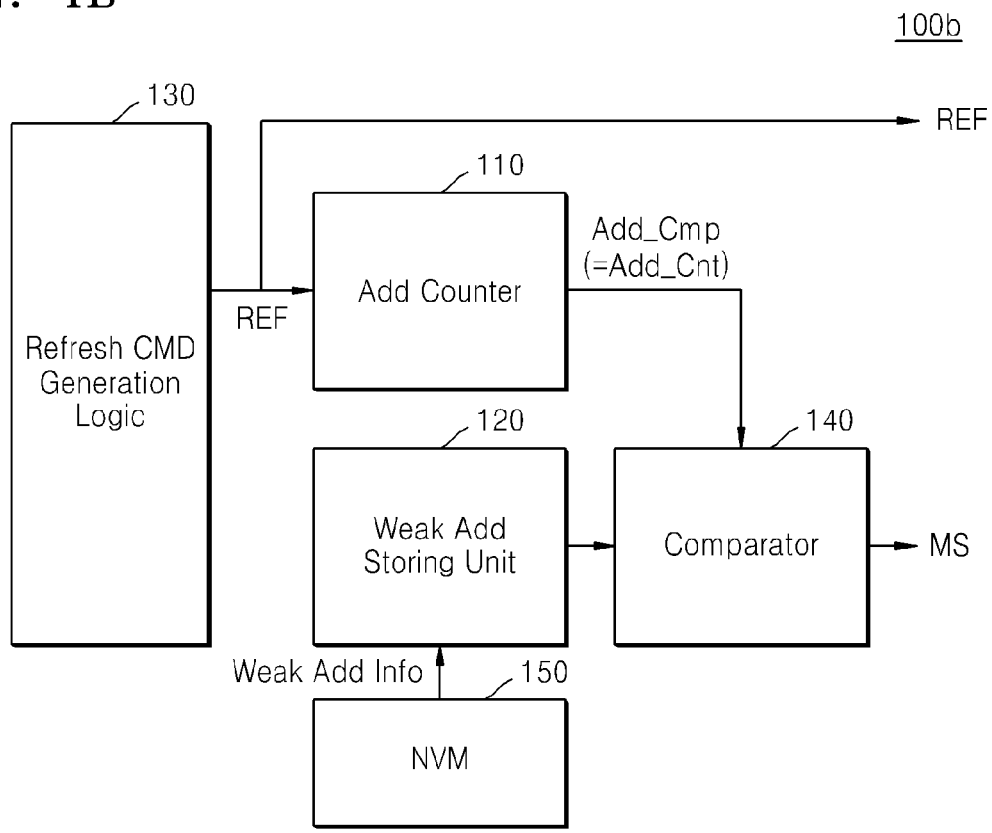
FIG. 4B is a block diagram illustrating another example of a memory controller illustrated in FIG. 1.

FIGS. 4A and 4B are block diagrams illustrating examples of memory controller 100 of FIG. 1.

Referring to FIGS. 4A and 4B, memory controllers 100a and 100b comprises an address counter 110 that generates a comparison address Add_Cmp, a weak address storing unit 120 that stores a weak address, and a comparator 140 that compares the weak address with comparison address Add_Cmp to generate a matching signal MS. Also, memory controllers 100a and 100b further comprise a refresh command generation logic unit 130 that generates a refresh command REF.

Refresh command generation logic unit 130 generates refresh command REF periodically. For example, if eight cell regions are in cell array 210 of semiconductor memory device 200 of FIG. 1 and a refresh period is 64 ms, refresh command REF may be generated in every period of 8 ms to refresh the cell regions sequentially.

Address counter 110 generates comparison address Add_Cmp based on refresh command REF. Thus, wherever refresh command REF is generated, comparison address Add_Cmp may be counted and output. However, the inventive concept is not limited thereto. As in a self refresh mode, if refresh command REF is not generated, address counter 110 may generate comparison address Add_Cmp by using a clock signal supplied to both address counter 110 and refresh counter 221 of semiconductor memory device 200 of FIG. 1.

Weak address storing unit 120 stores weak addresses corresponding to a weak cell region of semiconductor memory device 200 of FIG. 1. Also, where semiconductor memory device 200 comprises a plurality of chips, weak address storing unit 120 may store the weak addresses and chip identifications (IDs) of chips in which the weak addresses are included.

Comparator 140 receives comparison address Add_Cmp and the weak addresses to generate matching signal MS. A configuration and operation of comparator 140 will now be described with reference to FIGS. 5A through 7.

Weak address storing unit 120 comprises registers, a volatile memory, or a non-volatile memory that is a device for storing addresses. Weak address storing unit 120 may be implemented, for instance, by registers. If power is supplied to or a test signal is applied to memory system 1000 of FIG. 1, memory controller 100a may test data retention characteristics of cell regions of semiconductor memory device 200 of FIG. 1 and may store addresses of the cell regions having relatively low data retention characteristics in weak address storing unit 120. Where weak address storing unit 120 comprises registers or volatile memory, if power supply is stopped, information regarding weak addresses is lost. Thus, memory controller 100a should test data retention characteristics of the cell regions and should store them in weak address storing unit 120 where power is applied to memory system 1000 of FIG. 1.

As illustrated in FIG. 4B, where memory controller 100b comprises an additional non-volatile memory 150, where power is first supplied to memory system 1000 of FIG. 1, memory controller 100b may test data retention characteristics of the cell regions of semiconductor memory device 200 of FIG. 1, may store weak addresses in the non-volatile memory 150. Subsequently, where power is supplied to memory system 1000 of FIG. 1, memory controller 100b may upload the weak addresses stored in the non-volatile memory 150 to weak address storing unit 120 comprising non-volatile devices, such as registers, to use them.

Figure 5A:
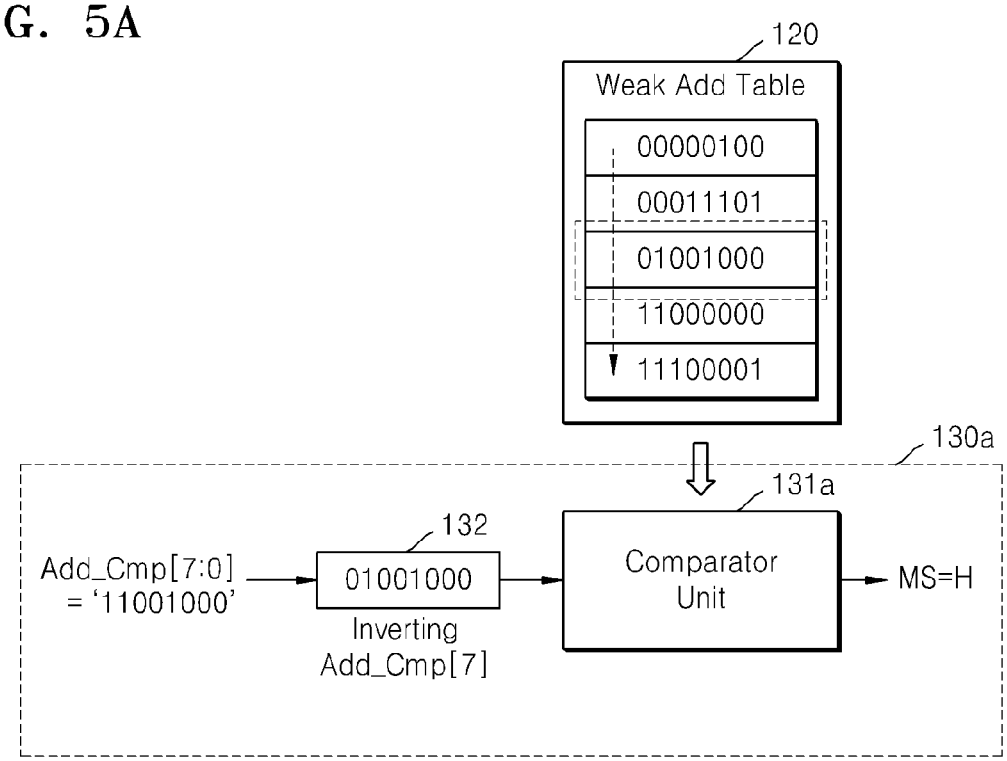
FIG. 5A is a block diagram illustrating an example of a comparator illustrated in FIG. 4A.
Figure 5B:
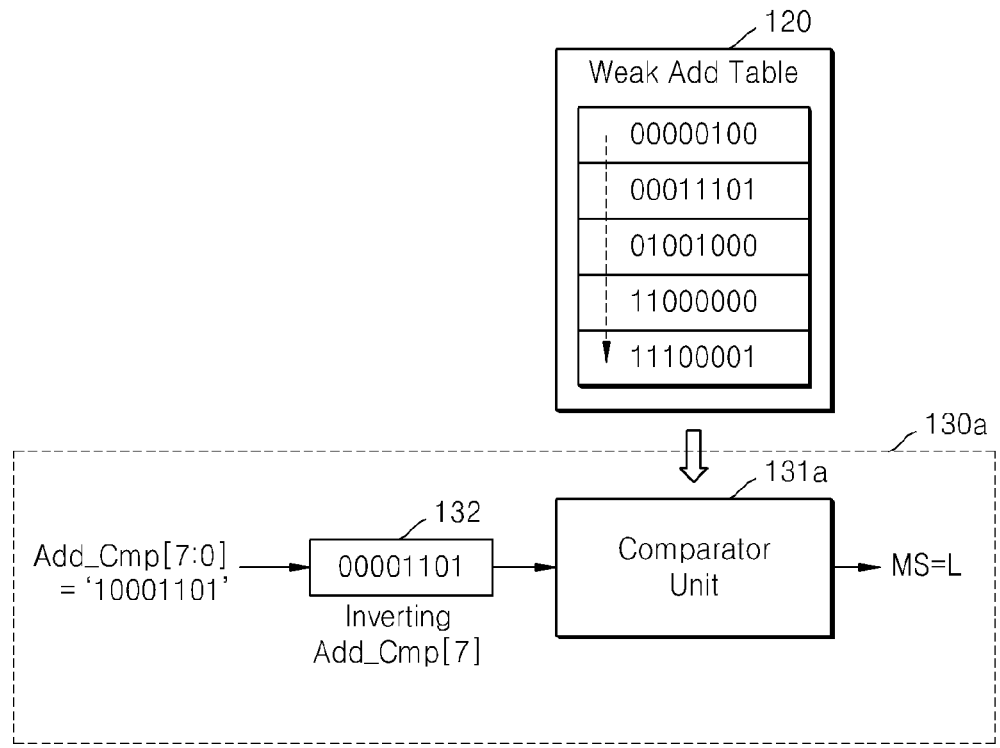
FIG. 5B is a block diagram illustrating another example of the comparator illustrated in FIG. 4A.

FIGS. 5A and 5B illustrate an example of comparator 140 illustrated in FIG. 4A, as an example in which matching signal MS is generated.

Referring to FIGS. 5A and 5B, a comparator 130a comprises a converter 132 and a comparator unit 131a. An address comprises a plurality of bits, for example, eight bits. Converter 132 inverts the MSB Add_Cmp[7] of a comparison address Add_Cmp[7:0]. Comparator unit 131a receives weak addresses from weak address storing unit 120. Comparator unit 131a compares values of the inverted address and the weak address and outputs matching signals MS. As illustrated in FIG. 5A, if comparison address Add_Cmp[7:0] is 11001000, an address that is obtained by inverting the MSB of comparison address Add_Cmp[7:0] is 01001000. Because one of the weak addresses is 01001000, the inverted address corresponds to one of the weak addresses and thus matching signal MS having a second logic state (e.g., logic high) may be output. On the other hand, as illustrated in FIG. 5B, if comparison address Add_Cmp[7:0] is 10001101, an address that is obtained by inverting the MSB of comparison address Add_Cmp[7:0] is 00001101, and a weak address corresponding to the inverted address is not present and thus matching signal MS having a first logic state (e.g., logic low) may be output.

Figure 6A:
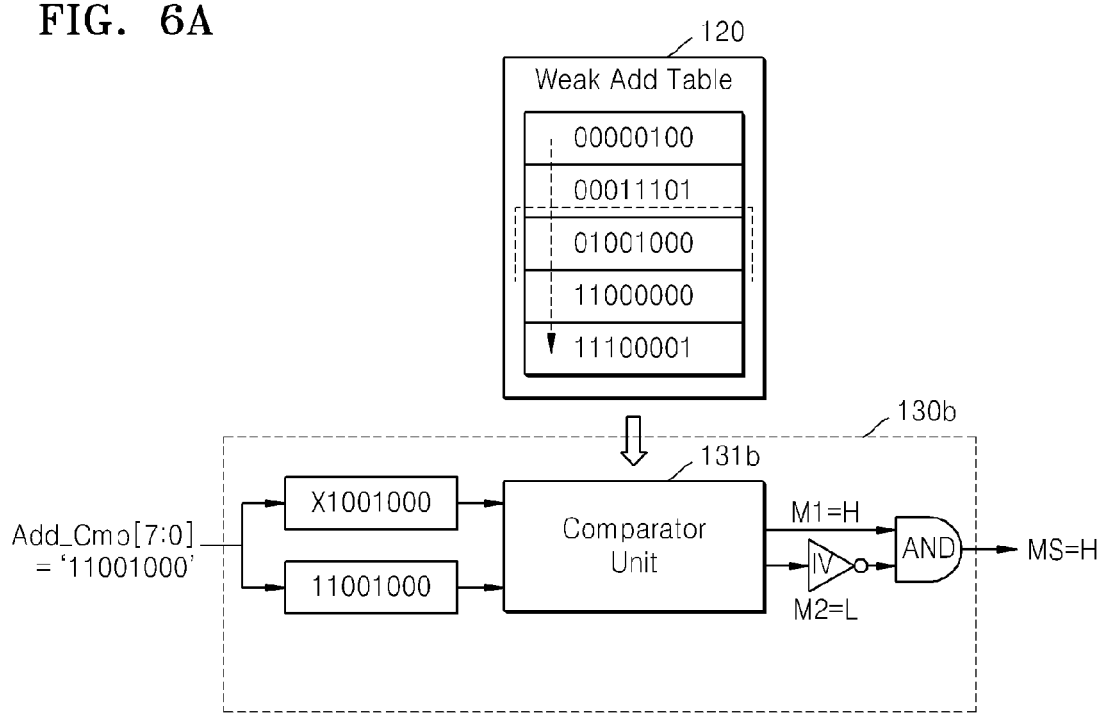
FIG. 6A illustrates another example of the comparator of FIG. 4A.
Figure 6B:
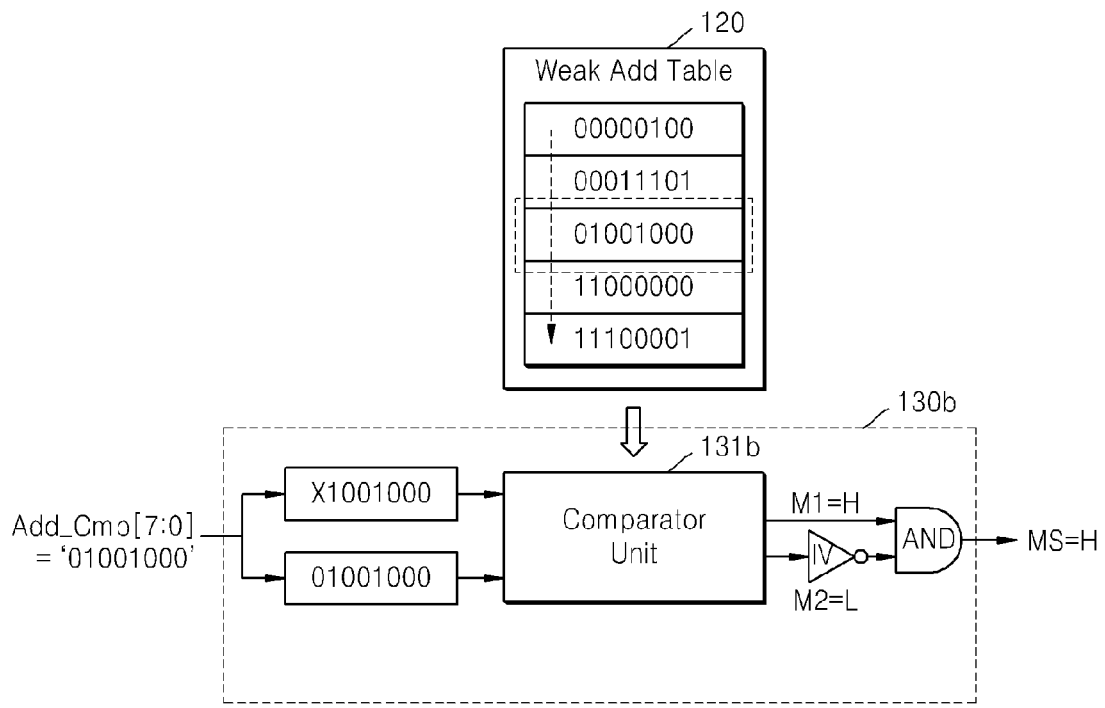
FIG. 6B illustrates another example of the comparator of FIG. 4A.

FIGS. 6A and 6B illustrate another example of comparator 140 of FIG. 4A, as another example in which matching signal MS is generated.

Referring to FIGS. 6A and 6B, a comparator 130b comprises a comparator unit 131b, an inverter IV, and a logic device (e.g., an AND gate). Comparator unit 131b may receive the lower seven bits, excluding the MSB of comparison address Add_Cmp[7:0], may compare the lower seven bits with the lower seven bits of the weak addresses to output a first matching signal M1, and may compare comparison address Add_Cmp[7:0] with the weak addresses to output a second matching signal M2. Matching signal MS may be generated based on first matching signal M1 and a value that is obtained by inverting second matching signal M2.

As illustrated in FIG. 6A, if comparison address Add_Cmp[7:0] is 11001000, the lower seven bits, excluding the MSB of comparison address Add_Cmp[7:0], are 1001000, and if the lower seven bits are compared with the lower seven bits of the weak addresses, a weak address having the same value is present. Thus, first matching signal M1 is output in a second logic state (e.g., logic high). If comparison address Add_Cmp[7:0] and the weak address are compared with each other, a weak address that corresponds to 11001000 that is comparison address Add_Cmp[7:0] is not present. Thus, second matching signal M2 may be output in a logic low state. Because first matching signal M1 and a value that is obtained by inverting second matching signal M2 are input to an AND gate AND, a logic high signal is input to two input terminals of AND gate AND so that a matching signal MS having a logic high state may be output.

On the other hand, as illustrated in FIG. 6B, if comparison address Add_Cmp[7:0] is 01001000, the lower seven bits Add_Cmp[6:0], excluding the MSB of comparison address Add_Cmp[7:0], are 1001000, and if the lower seven bits Add_Cmp[6:0] are compared with the lower seven bits of the weak addresses, a weak address having the same value is present. Thus, first matching signal M1 is output in a second logic state (e.g., logic high). If comparison address Add_Cmp [7:0] and the weak address are compared with each other, a weak address that corresponds to 01001000 that is comparison address Add_Cmp[7:0] is present. Thus, second matching signal M2 may be output in a logic high state. Because first matching signal M1 and a value that is obtained by inverting second matching signal M2 are input to AND gate AND, a logic low signal is input to one input terminal of AND gate AND, and a logic high signal is input to the other input terminal of AND gate AND so that matching signal MS having a logic low state may be output.

Figure 7:
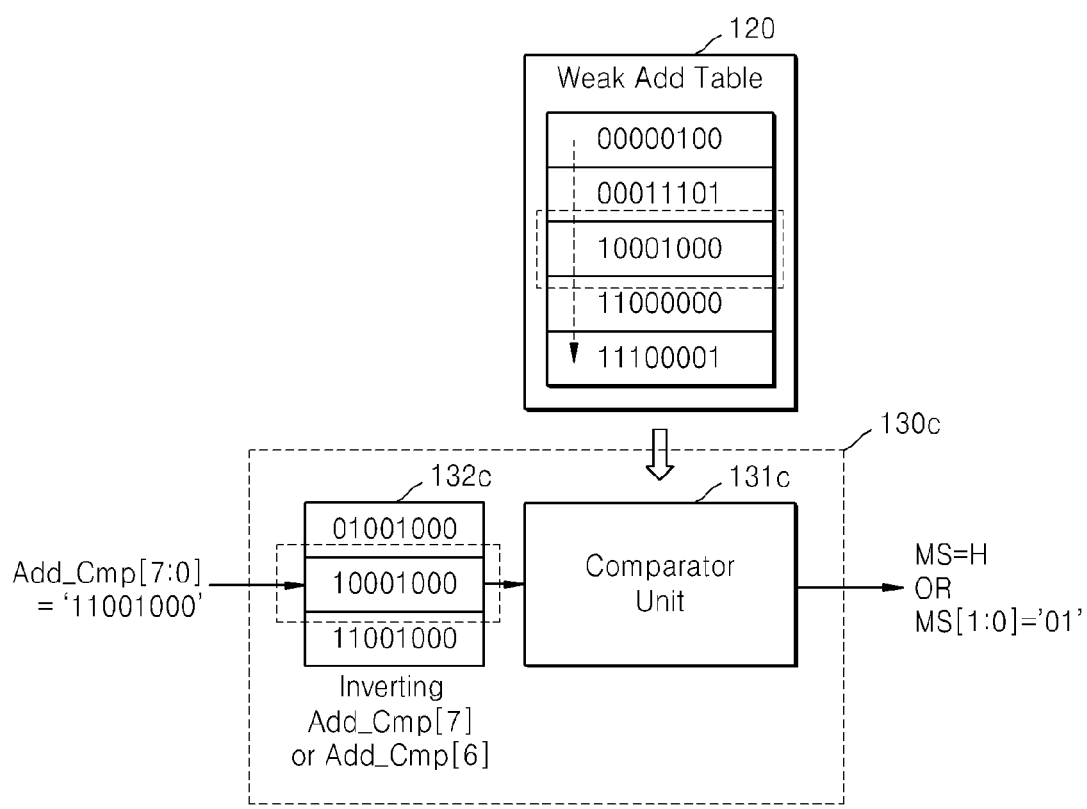
FIG. 7 illustrates another example of the comparator of FIG. 4A.

FIG. 7 illustrates another example of comparator 140 of FIG. 4A, as another example in which matching signal MS is generated.

Referring to FIG. 7, a comparator 130c comprises a converter 132c and a comparator unit 131c. Converter 132c may invert at least one bit of the upper two bits Add_Cmp[7:6] of comparison address Add_Cmp[7:0]. Comparator unit 131c receives weak addresses from weak address storing unit 120. Comparator unit 131c compares a value of the inverted address and values of weak addresses to output a matching signal. As illustrated in FIG. 7, if comparison address Add_Cmp[7:0] is 11001000, addresses that are generated by inverting at least one bit of the upper two bits Add_Cmp[7:6] are 01001000, 10001000, and 11001000. Because address 10001000 that is generated by inverting a second bit Add_Cmp[6] of comparison address Add_Cmp[7:0] corresponds to one of the weak addresses, a matching signal MS having a logic high state may be output. Alternatively, where a two-bit matching signal MS[1:0] is output, matching signal MS[1:0] may be output as 01.

Although various examples of comparator 140 have been described with reference to FIGS. 5A through 7, the inventive concept is not limited to these examples. In alternative embodiments, for instance, comparator 140 may be designed to have various other configurations.

Figure 8:
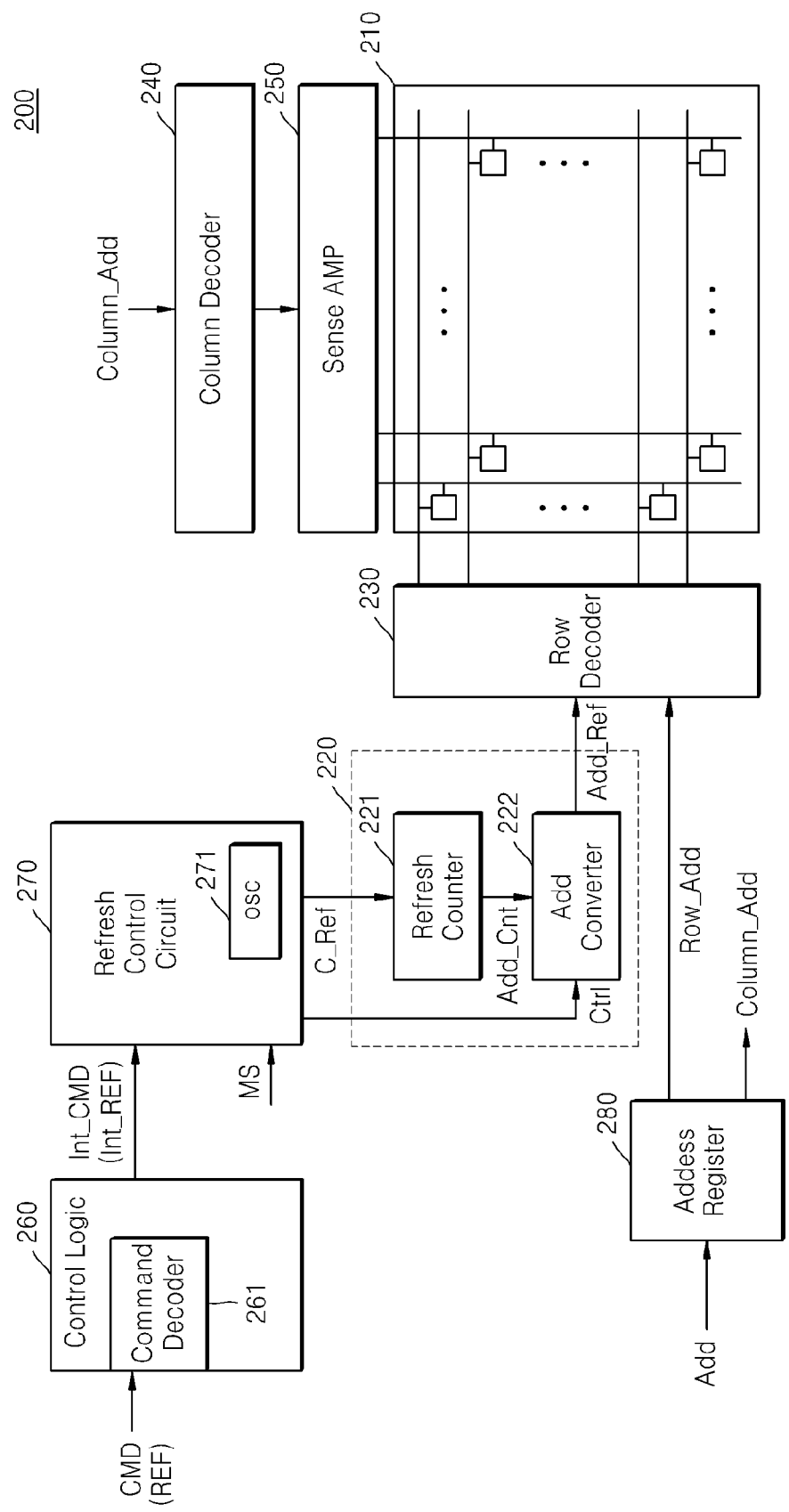
FIG. 8 is a block diagram of an example of the semiconductor memory device illustrated in FIG. 1.

FIG. 8 is a block diagram of an example of semiconductor memory device 200 of FIG. 1.

Referring to FIG. 8, semiconductor memory device 200 comprises a memory cell array 210 comprising a plurality of memory cells, a row decoder 230 that drives rows of memory cell array 210, a column decoder 240 that drives columns of memory cell array 210, and a sense amplifier 250 that senses and amplifies data. Semiconductor memory device 200 further comprises a control logic 260, an address register 280, a refresh control circuit 270, and a refresh address generator 220 that are peripheral circuits that drive memory cell array 210 or perform a refresh operation.

Control logic 260 drives memory cell array 210 or controls a refresh operation by receiving a command CMD from an external device. Control logic 260 comprises a command decoder 261. Command decoder 261 generates control signals by using received command CMD. Command decoder 261 generates an internal command Int_CMD by decoding command CMD received from the external device. Where command CMD from the external device is a refresh command REF, command decoder 261 generates an internal refresh command Int_REF by decoding refresh command REF and supplies the generated internal refresh command Int_REF to refresh control circuit 270.

Address register 280 stores a received address Add and then supplies stored address Add to row decoder 230 and column decoder 240. In this case, stored address Add may be classified into a row address Row_Add and a column address Column_Add, and row address Row_Add and column address Column_Add may be supplied to row decoder 230 and column decoder 240, respectively.

Refresh control circuit 270 receives the internal refresh command Int_REF and generates a refresh control signal C_Ref in response to the internal refresh command Int_REF. For example, to refresh all the memory cells in memory cell array 210, a plurality of refresh commands REF may be provided from the external device in one refresh period, and the internal refresh command Int_REF and the refresh control signal C_Ref may be generated in response to each refresh command REF. Alternatively, in the self refresh mode, a clock signal is periodically generated by an internal oscillator 271 in response to an external command that indicates a self refresh enter mode, for example, a standby signal or sleep signal, and the refresh control signal C_Ref may be generated by refresh control circuit 271 in response to the clock signal.

Also, refresh control circuit 270 may generate a converted control signal Ctrl based on a received matching signal MS. The converted control signal Ctrl may have the same logic state as or an opposite logic state to that of matching signal MS and may be output concurrently with the refresh control signal C_Ref or with a predetermined time delay, compared to the refresh control signal C_Ref.

Refresh address generator 220 generates a counting address Add_Cnt for sequentially refreshing a plurality of cell regions of memory cell array 210 and converts at least one bit of counting address Add_Cnt in response to the received matching signal MS so that at least two cell regions are refreshed concurrently. Refresh address generator 220 comprises a refresh counter 221 and an address converter 222. Refresh counter 221 performs a counting operation in response to the refresh control signal C_Ref and generates a counting address Add_Cnt. Counting address Add_Cnt is an address that drives rows to perform the refresh operation on memory cell array 210. Memory cell array 210 comprises a plurality of cell regions, and counting address Add_Cnt comprises at least one address bit. The unit of the cell regions of memory cell array 210 may be pages that are selected by one row address. At least one page is selected according to a bit value of counting address Add_Cnt, and memory cells in the selected page are refreshed.

Address converter 222 converts at least one bit of counting address Add_Cnt in response to the converted control signal Ctrl to generate a refresh address Add_Ref. As the generated refresh address Add_Ref is provided to row decoder 230, a region of memory cell array 210, in which refresh is to be performed, is selected.

The converting operation of address converter 222 comprises an operation of do-not-care processing or not do-not-care processing at least one bit of counting address Add_Cnt. As at least one bit of counting address Add_Cnt is do-not-care processed, the number of cell regions on which refresh is to be performed may be increased. For example, where at least one bit of counting address Add_Cnt is not do-not-care processed, one cell region that corresponds to counting address Add_Cnt is refreshed; where at least one bit of counting address Add_Cnt is do-not-care processed, a cell region that corresponds to counting address Add_Cnt and a cell region that corresponds to an modified version of that address are refreshed so that at least two cell regions are refreshed.

As described above, semiconductor memory device 200 illustrated in FIG. 8 may refresh only a cell region that corresponds to counting address Add_Cnt in response to the received matching signal MS, or it may additionally refresh a cell region that corresponds to an address generated by inverting at least one bit of counting address Add_Cnt. In this case, the inverted address corresponds to one of the weak addresses. Thus, semiconductor memory device 200 refreshes the cell regions sequentially according to counting address Add_Cnt, and if matching signal MS having a logic high state is applied to semiconductor memory device 200, semiconductor memory device 200 may perform a refresh operation on counting address Add_Cnt and at least one weak address so that a refresh frequency of weak cell regions for the entire refresh period may be increased.

Figure 9:
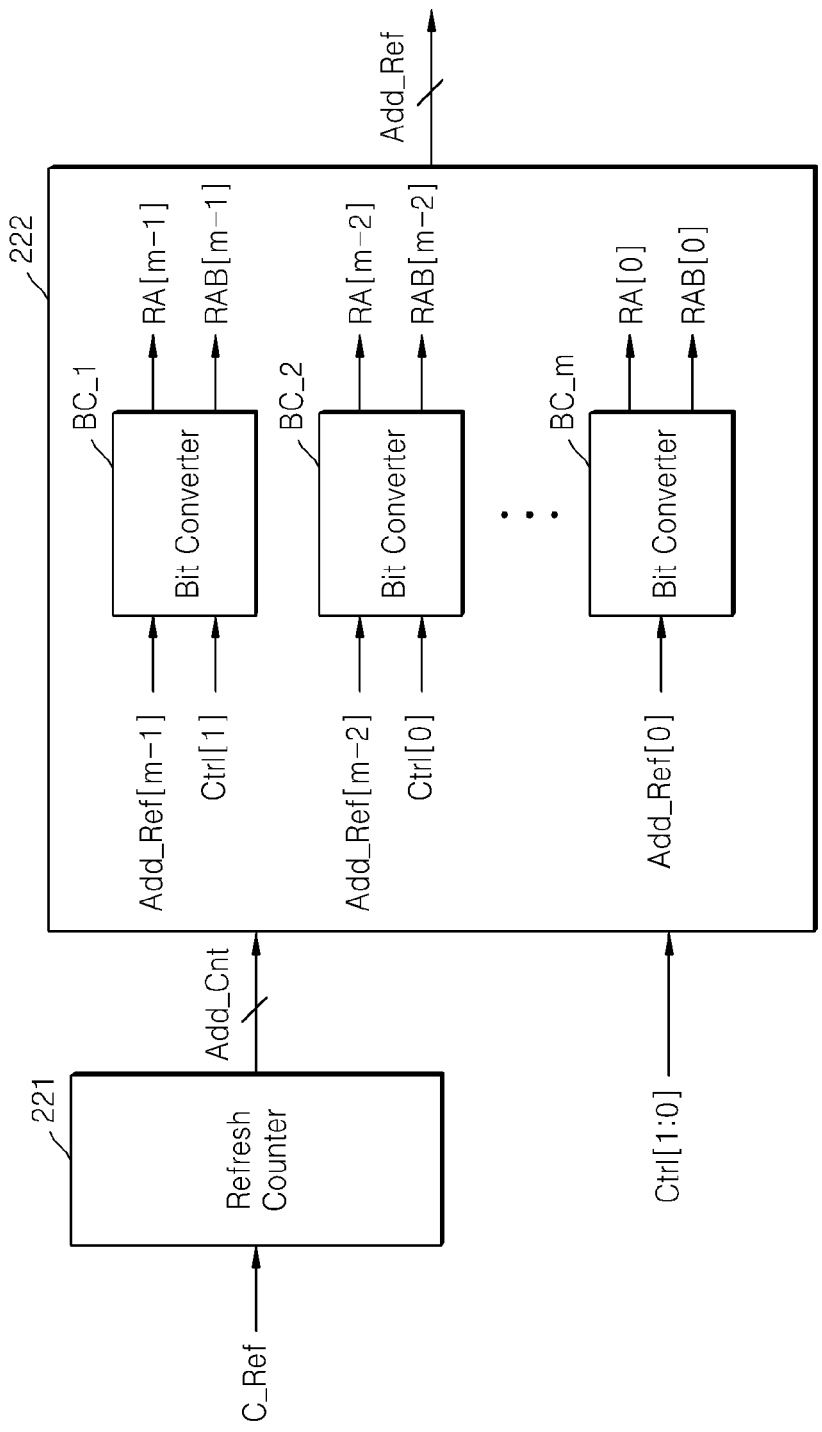
FIG. 9 is a block diagram of an example of an address converter illustrated in FIG. 8.

FIG. 9 is a block diagram of an example of address converter 222 illustrated in FIG. 8. For convenience of explanation, address converter 222 will be shown together with refresh counter 221.

Refresh counter 221 performs a counting operation in response to the refresh control signal C_Ref and generates counting address Add_Cnt. Counting address Add_Cnt designates one cell region on which a refresh operation has been performed, from among the cell regions of memory cell array 210 of FIG. 8. Counting address Add_Cnt comprises at least one address bit and may have a value that is sequentially increased where counting address Add_Cnt is counted in response to the refresh control signal C_Ref.

Address converter 222 comprises at least one bit converter BC_1 to BC_m. For example, where counting address Add_Cnt comprises "m" bits, address converter 222 comprises m bit converters BC_1 to BC_m. Complementary outputs RA[m−1], RAB[m−1], RA[m−2], RAB[m−2], . . . , RA[0], and RA[0] of the m bit converts BC_1 to BC_m are output as a refresh address Add_Ref. Each of the m bit converters BC_1 to BC_m receives m bits of counting address Add_Cnt. A first bit converter BC_1 may receive an m-th bit AC[m−1] as an MSB of counting address Add_Cnt, and an m-th bit converter BC_m may receive a first bit AC[0] as a least significant bit (LSB) of counting address Add_Cnt.

Converted control signals, for example, first and second control signals Ctrl[1] and Ctrl[0] may be used in converting at least one bit of counting address Add_Cnt. In this embodiment, the converted control signals Ctrl are two-bit signals. However, the inventive concept is not limited thereto. For instance, the converted control signal Ctrl may be a one-bit signal or a three-or-more bit signal.

A bit converting operation comprises an operation of do-not-care processing or not do-not-care processing at least one bit of counting address Add_Cnt. Where the do-not-care state of two MSBs of counting address Add_Cnt is controlled, the first bit converter BC_1 receives the m-th bit AC[m−1] and controls the do-not-care state of the m-th bit AC[m−1] in response to the first control signal Ctrl[1]. For example, where the first control signal Ctrl[1] has a first logic state (e.g., logic low), the first bit converter BC_1 do-not-care processes the m-th bit AC[m−1], and where the first control signal Ctrl[1] has a second logic state (e.g., logic high), the first bit converter BC_1 does not do-not-care process the m-th bit AC[m−1]. Where the m-th bit AC[m−1] is do-not-care processed, complementary outputs RA[m−1] and RAB[m−1] that correspond to the m-th bit AC[m−1] have the same state.

On the other hand, where the m-th bit AC[m−1] is not do-not-care processed, complementary outputs RA[m−1] and RAB[m−1] that correspond to the m-th bit AC[m−1] have different states. Complementary outputs RA[m−1] and RAB[m−1] have information corresponding to one bit of counting address Add_Cnt.

By performing a similar operation, a second bit converter BC_2 receives an (m−1)-th bit AC[m−2] and controls the do-not-care state of the (m−2)-th bit AC[m−2] in response to the second control signal Ctrl[0]. Where the (m−1)-th bit AC[m−2] is do-not-care processed, complementary outputs RA[m−2] and RAB[m−2] that correspond to the (m−1)-th bit AC[m−2] have the same state. On the other hand, where the (m−1)-th bit AC[m−2] is not do-not-care processed, complementary outputs RA[m−2] and RAB[m−2] have different states.

For example, where counting address Add_Cnt has information corresponding to 8 bits and only the do-not-care state of the m-th bit AC[m−1] is controlled, a region of memory cell array 210 to be designated by counting address Add_Cnt is changed according to the do-not-care state of the m-th bit AC[m−1]. That is, where the m-th bit AC[m−1] is not do-not-care processed, a memory cell of one of 64 regions may be refreshed based on the 8-bit information of counting address Add_Cnt. On the other hand, that is, where the m-th bit AC[m−1] is do-not-care processed, a region is selected using only information of the remaining bits of counting address Add_Cnt regardless of the m-th bit AC[m−1] so that a memory cell of two of 64 regions may be refreshed. That is, by controlling the do-not-care state of at least one bit of counting address Add_Cnt, a memory cell region on which refresh has been performed may be controlled according to one refresh control signal.

Figure 10:
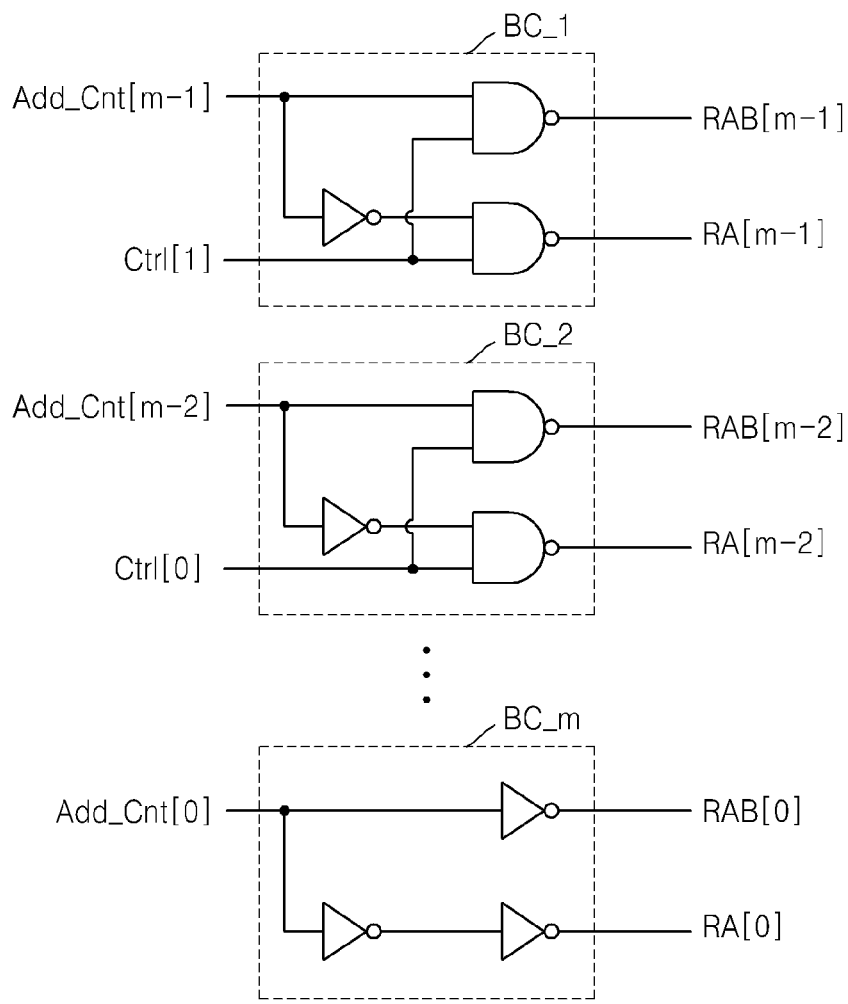
FIG. 10 is a circuit diagram illustrating an example of an address converter illustrated in FIG. 9.

FIG. 10 is a circuit diagram illustrating an example of address converter 222 of FIG. 9. As illustrated in FIG. 10, address converter 222 comprises first through m-th bit converters BC_1 to BC_m. Also, each of the first through m-th bit converters BC_1 to BC_m comprises at least one logic device. For example, where the first bit converter BC_1 performs a conversion operation of controlling the do-not-care state of a corresponding bit of counting address Add_Cnt in response to the converted control signal Ctrl, the first bit converter BC_1 comprises at least one logic device that receives a first control signal Ctrl[1], for example, an NAND gate, apart from an inverter. On the other hand, the m-th bit converter BC_m may comprise at least one inverter that generates complementary bits RA[0] and RAB[0] by using a corresponding bit without controlling the do-not-care state of the corresponding bit of counting address Add_Cnt. Outputs RA[0], RAB[0] to RA[m−1], RAB[m−1] of address converter 222 are provided as refresh address Add_Ref to row decoder 230 of FIG. 8.

The address converting operation according to control signals Ctrl[1] and Ctrl1[0] will now be described below with reference to the first bit converter BC_1.

Where the first control signal Ctrl[1] has a first logic state (e.g., logic low), the first bit converter BC_1 generates complementary outputs RA[m−1] and RAB[m−1] having the same state (e.g., logic high) regardless of a logic state of the m-th bit AC[m−1] of counting address Add_Cnt. Complementary outputs RA[m−1] and RAB[m−1] of the first bit converter BC_1 are information of the m-th bit of counting address Add_Cnt and are provided to row decoder 230 of FIG. 8. As the m-th bit of counting address Add_Cnt is do-not-care processed, memory cells of at least two regions are refreshed.

On the other hand, where the first control signal Ctrl[1] has a second logic state (e.g., logic high), the first bit converter BC_1 generates complementary outputs RA[m−1] and RAB[m−1] that correspond to the logic state of the m-th bit AC[m−1] of counting address Add_Cnt. For example, where the m-th bit AC[m−1] of counting address Add_Cnt has a logic high state, complementary output RA[m−1] has a logic high state, and complementary output RAB[m−1] has a logic low state. Complementary outputs RA[m−1] and RAB[m−1] having opposite states are provided to row decoder 320, and memory cells of one region that corresponds to the states of complementary outputs RA[m−1] and RAB[m−1] are refreshed.

Figure 11:
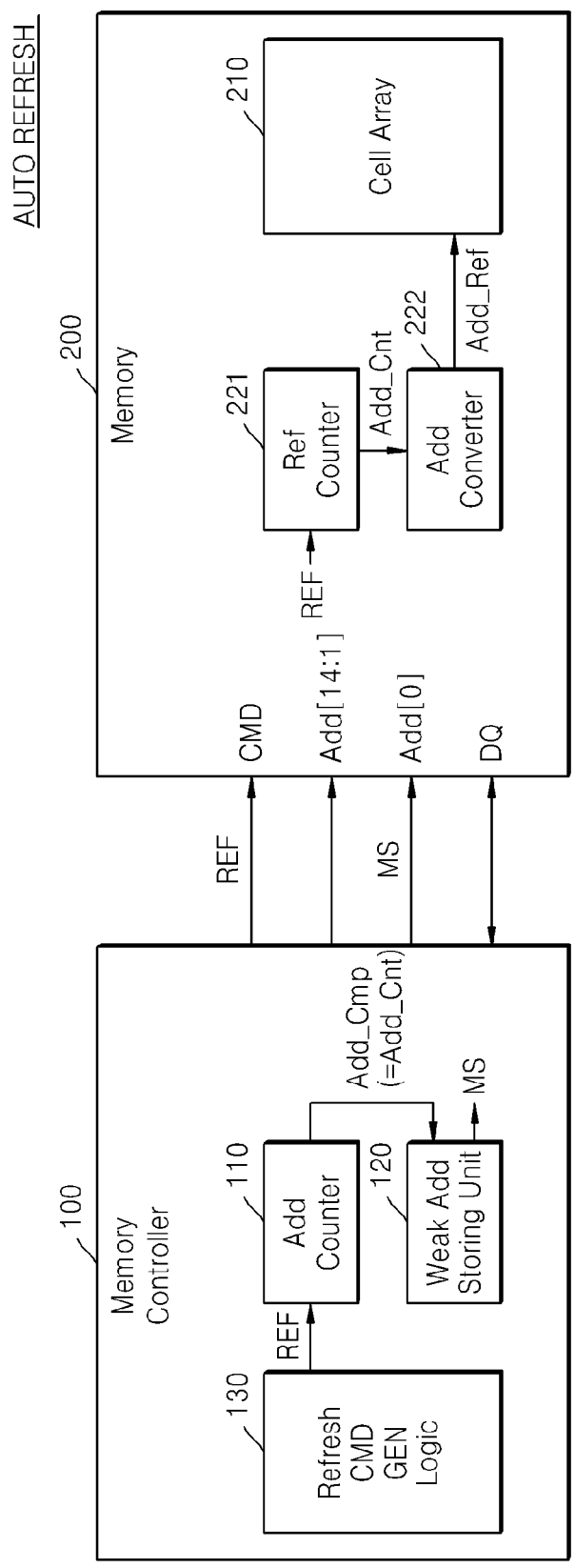
FIG. 11 is a block diagram of an example in which a refresh operation is performed in an auto refresh mode.

FIG. 11 is a block diagram of an example in which a refresh operation is performed in an auto refresh mode. In the auto refresh mode, semiconductor memory device 200 performs a refresh operation where refresh command REF is received from memory controller 100. Address counter 110 of memory controller 100 counts reference address Add_Cmp based on refresh command REF where refresh command REF is generated by refresh command generation logic unit 130. Memory controller 100 generates matching signal MS based on reference address Add_Cmp and the weak address stored in weak address storing unit 120 and then transmits refresh command REF and matching signal MS to semiconductor memory device 200. Where refresh command REF is transmitted, no address is transmitted. Thus, matching signal MS may be transmitted via at least one address pin (e.g., Add[0]) from among address pins Add[14:0]. However, the inventive concept is not limited thereto, and matching signal MS may also be transmitted via an additional port.

Semiconductor memory device 200 counts counting address Add_Cnt based on the received refresh command REF. Counting address Add_Cnt is converted based on matching signal MS, and one cell region, or at least two cell regions from among the cell regions of memory cell array 210 may be selected based on matching signal MS.

Reference address Add_Cmp generated by address counter 110 of memory controller 100 and counting address Add_Cnt generated by refresh counter 221 of semiconductor memory device 200 are typically the same. Thus, address counter 110 and refresh counter 221 are required to operate in synchronization with each other. In the auto refresh mode, address counter 110 and refresh counter 221 operate based on refresh command CMD and thus may operate in synchronization with each other.

Figure 12:
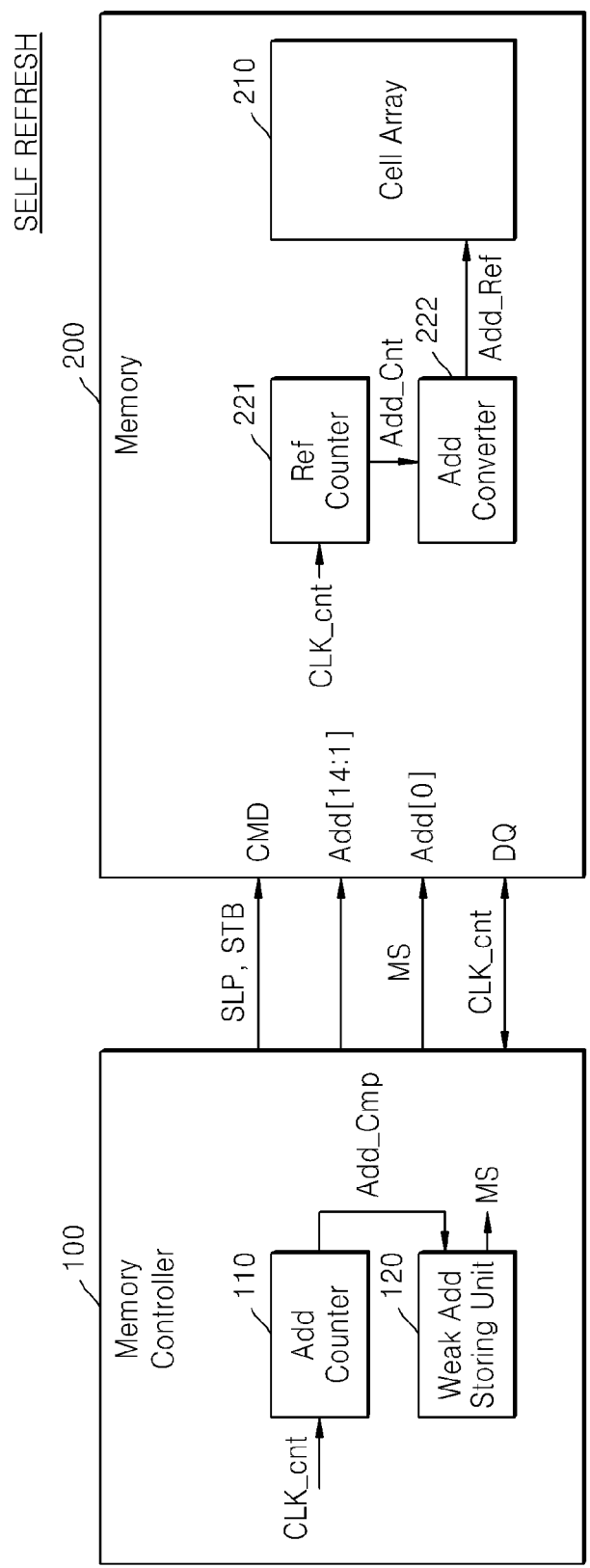
FIG. 12 is a block diagram of an example in which a refresh operation is performed in a self refresh mode.

FIG. 12 is a block diagram of an example in which a refresh operation is performed in a self refresh mode. Semiconductor memory device 200 performs self refresh if a predetermined command CMD that indicates self refresh mode entrance, for example, a standby signal STB or a sleep signal SLP, is received from memory controller 100. In the self refresh mode, semiconductor memory device 200 may generate counting address Add_Cnt based on a counting clock signal CLK_cnt generated in semiconductor memory device 200.

Counting clock signal CLK_cnt is transmitted to memory controller 100 and is used as a clock signal for counting address counter 110. This allows, address counter 110 and refresh counter 221 to operate in synchronization with each other. In this case, counting clock signal CLK_cnt may be transmitted to memory controller 100 via an additional port or a data signal pin DQ.

Counting clock signal CLK_cnt may also be generated in memory controller 100. Counting clock signal CLK_cnt generated in memory controller 100 may be provided to address counter 110 and concurrently may be provided to semiconductor memory device 200 and thus may be used as a clock signal for counting counting address Add_Cnt by using refresh counter 221. Counting clock signal CLK_cnt generated by memory controller 100 may also be provided to semiconductor memory device 200 via an additional port or the data signal pin DQ.

Figure 13:
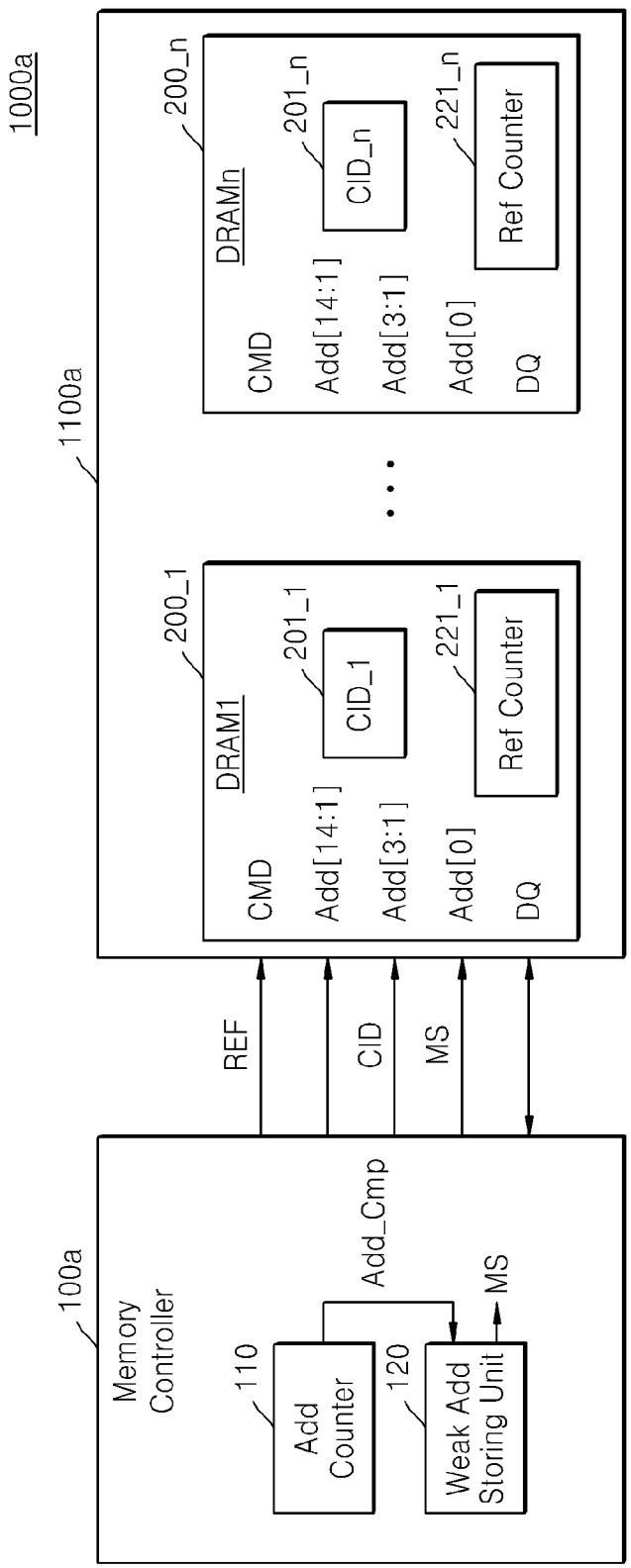
FIG. 13 is a block diagram of a memory system comprising a memory module according to an embodiment of the inventive concept.

FIG. 13 is a block diagram of a memory system 1000a comprising a memory module 1100a according to an embodiment of the inventive concept.

Referring to FIG. 13, memory system 1000a comprises a memory controller 100 and memory module 1100a. Memory module 1100a comprises at least one semiconductor memory device 200_1 to 200_n, and semiconductor memory devices 200_1 to 200_n may be DRAM chips. Semiconductor memory devices 200_1 to 200_n may respectively comprise refresh counters 221_1 to 221_n and unique chip IDs CID_1 to CID_n. Weak address storing unit 120 of memory controller 100 may store weak addresses of semiconductor memory devices 200_1 to 200_n and chip IDs CID of semiconductor memory devices 200_1 to 200_n in which the weak addresses are included. If a weak address corresponding to comparison address Add_Cmp is present, weak address storing unit 120 transmits matching signal MS and chip IDs CID of semiconductor memory devices 200_1 to 200_n in which the weak address corresponding to comparison address Add_Cmp is included, to semiconductor memory devices 200_1 to 200_n. In this case, in the auto refresh mode, refresh command REF is also transmitted to each of semiconductor memory devices 200_1 to 200_n. Semiconductor memory devices 200_1 to 200_n determine whether received chip IDs correspond to their own chip IDs CID_1 to CID_n. If it is determined that received chip IDs do not correspond to their own chip IDs CID_1 to CID_n, semiconductor memory devices 200_1 to 200_n refresh one cell region corresponding to a counting address Add_Cnt. Otherwise, if it is determined that received chip IDs correspond to their own chip IDs CID_1 to CID_n, semiconductor memory devices 200_1 to 200_n may refresh at least two cell regions by converting at least one bit of counting address Add_Cnt based on matching signal MS.

Figure 14:
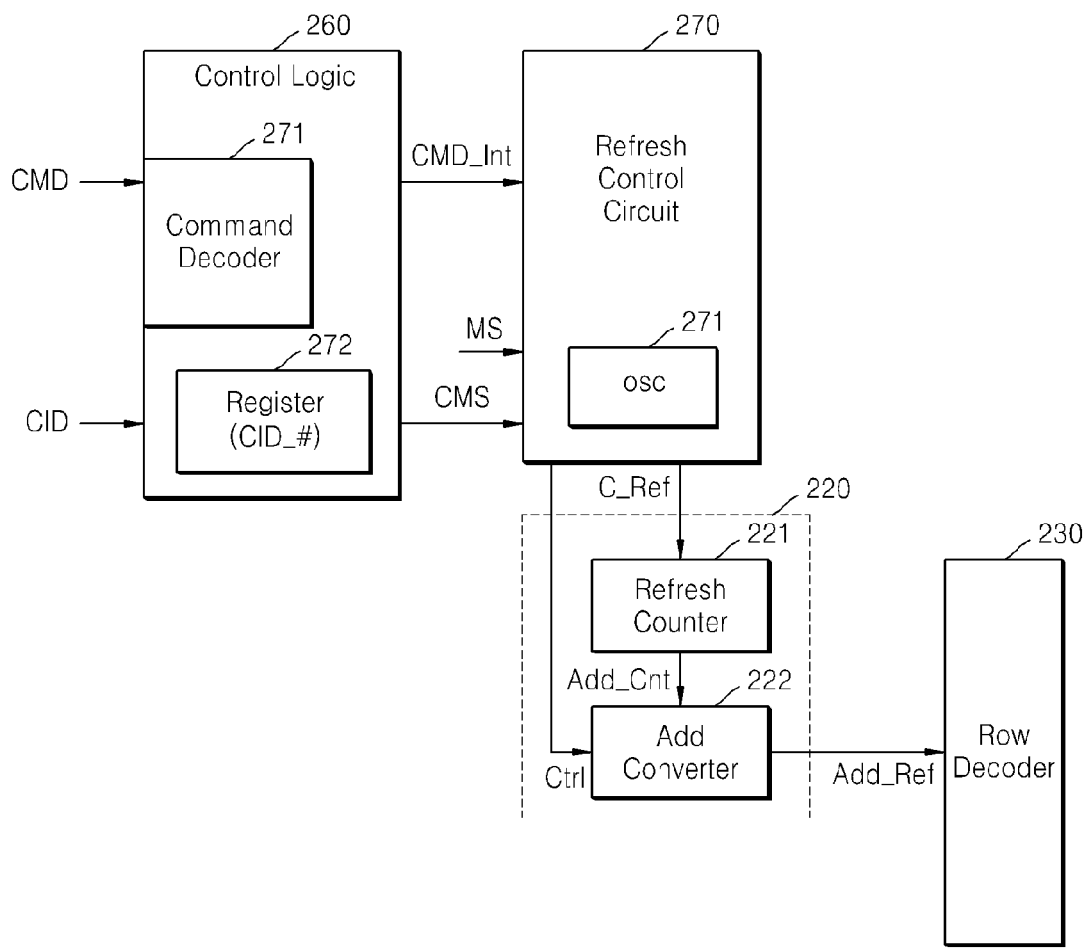
FIG. 14 is a block diagram of an example of a semiconductor memory device illustrated in FIG. 13.

FIG. 14 is a block diagram of an example of a semiconductor memory device as illustrated in FIG. 13. A configuration and operation of the semiconductor memory device illustrated in FIG. 14 is similar to that of the semiconductor memory device of FIG. 8. Thus, redundant descriptions thereof will be omitted. The semiconductor memory device of FIG. 14 receives a chip ID CID from an external device, determines whether received chip ID CIP is the same as its own chip ID, and determines whether at least one bit of the counting address is do-not-care processed, according to the result of the determination.

Control logic 260 receives chip ID CID, determines whether a chip ID CID_# of the semiconductor memory device, which is stored in a mode register set 272, is the same as received chip ID CID, and outputs a chip matching signal CMS according to the result of the determination. In this case, chip ID CID_# of the semiconductor memory device may be allocated by memory controller 100a of FIG. 13 after power is applied to the semiconductor memory device. Alternatively, chip ID CID# may be stored in non-volatile memory (not shown) or a fuse array (not shown) where memory module 1100a of FIG. 13 is manufactured.

A refresh control circuit 270 generates a converted control signal Ctrl based on the chip matching signal CMS and matching signal MS. For example, where both the chip matching signal CMS and matching signal MS are in a second logic state (e.g., logic high), refresh control circuit 270 may output the converted control signal Ctrl that do-not-care processes at least one bit of a counting address Add_Cnt.

Figure 15:
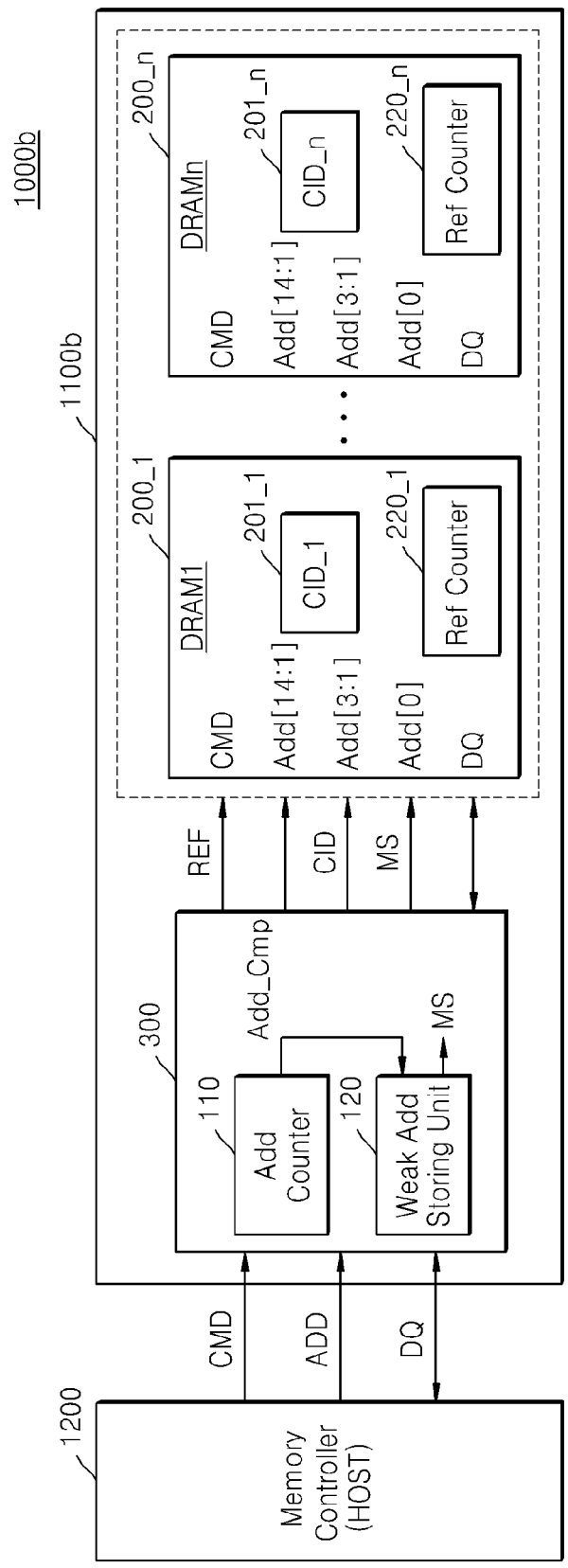
FIG. 15 is a block diagram of a memory system comprising a memory module according to another embodiment of the inventive concept.

FIG. 15 is a block diagram of a memory system 1000*b* comprising a memory module 1100*b* according to another embodiment of the inventive concept.

Referring to FIG. 15, memory system 1000*b* comprises a memory controller 1200 and memory module 1100*b*. Memory module 1100*b* comprises at least one semiconductor memory device 200_1 to 200__*n*, and semiconductor memory devices 200_1 to 200__*n* may be DRAM chips, for example. Also, memory module 1100*b* may further comprise a memory management chip 300 for managing a memory operation of semiconductor memory devices 200_1 to 200__*n*.

Memory controller 1200 supplies various signals for controlling semiconductor memory devices 200_1 to 200__*n* of memory module 1100*b*, for example, commands/addresses CMD/ADD, communicates with memory module 1100*b* to supply a data signal DQ to semiconductor memory devices 200_1 to 200__*n* or to receive data signal DQ from semiconductor memory devices 200_1 to 200__*n*.

Memory management chip 300 manages the memory operation of semiconductor memory devices 200_1 to 200__*n* and also manages a refresh operation. To manage the refresh operation, memory management chip 300 comprises an address counter 110 that generates a reference address Add_Cmp and a weak address storing unit 120 that stores weak addresses of semiconductor memory devices 200_1 to 200__*n* and chip IDs CID of semiconductor memory devices 200_1 to 200__*n*, which comprise the weak addresses.

Where receiving a refresh command from memory controller 1200, memory management chip 300 counts reference address Add_Cmp based on the refresh command and generates a matching signal MS based on reference address Add_Cmp and the stored weak address memory management chip 300 transmits matching signal MS, chip IDs CID of semiconductor memory devices 200_1 to 200__*n*, which comprise the weak addresses, and refresh command REF to semiconductor memory devices 200_1 to 200__*n*. Semiconductor memory devices 200_1 to 200__*n* may respectively comprise unique chip IDs 201_1 to 201__*n* and refresh counters 220_1 to 220__*n*. Semiconductor memory devices 200_1 to 200__*n* determine whether received chip IDs CID correspond to their own chip IDs CID_1 to CID_n. If it is determined that received chip IDs CID do not correspond to their own chip IDs CID_1 to CID_n, semiconductor memory devices 200_1 to 200__*n* refresh one cell region corresponding to counting address Add_Cnt. Otherwise, if it is determined that received chip IDs CID correspond to their own chip IDs CID_1 to CID_n, semiconductor memory devices 200_1 to 200__*n* may refresh at least two cell regions by converting at least one bit of counting address Add_Cnt based on matching signal MS.

Figure 16:
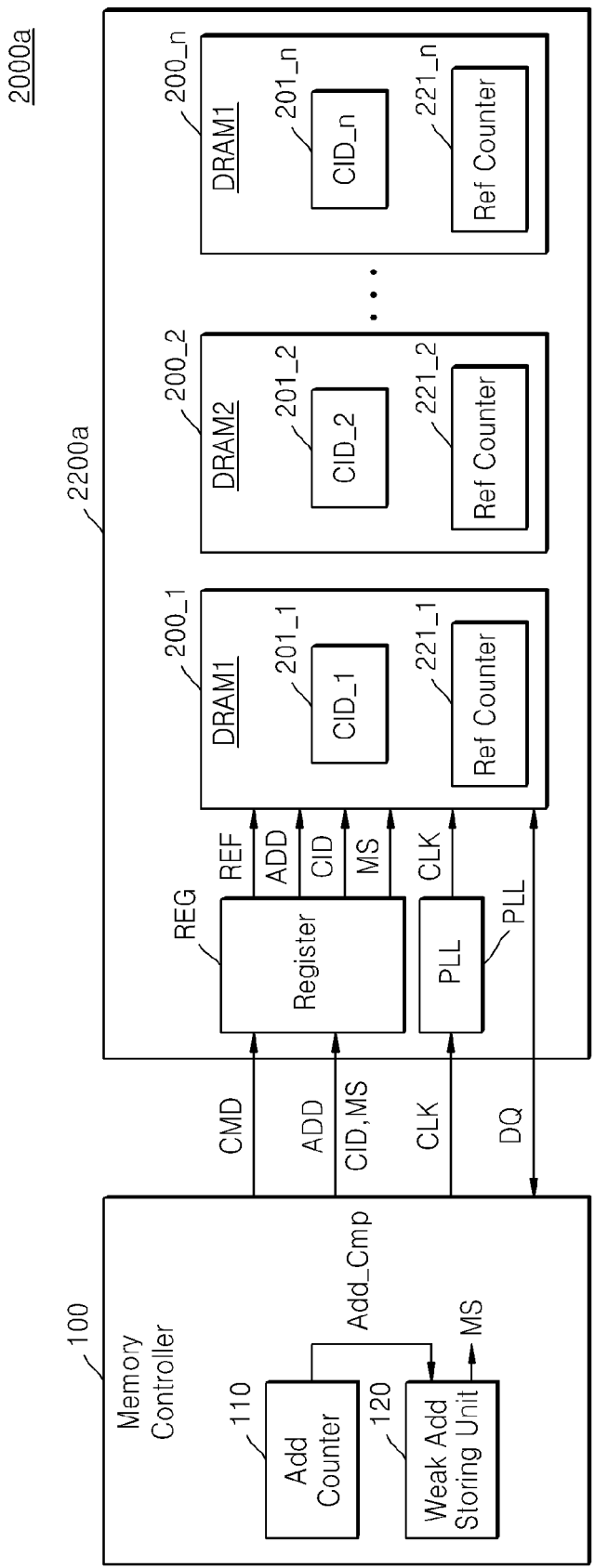
FIG. 16 is a block diagram of a memory system comprising a memory module according to another embodiment of the inventive concept.

FIG. 16 is a block diagram of a memory system 2000*a* comprising a memory module 2200*a* according to another embodiment of the inventive concept. As illustrated in FIG. 16, memory system 2000*a* comprises a memory controller 100 and memory module 2200*a*. Memory module 2200*a* comprises a plurality of semiconductor memory devices 200_1 to 200__*n*, and the plurality of semiconductor memory devices 200_1 to 200__*n* may be DRAM chips, for example. Memory module 2200*a* represents an example in which a registered dual in-line memory module (RDIMM) as a module for a server is used. A register REG and a phase-locked loop (PLL) PLL may be mounted on a module board of memory module 2200*a*.

Memory controller 100 supplies signals, such as a command CMD, an address ADD, and a clock signal CLK to memory module 220 and communicates with memory module 2200*a* via the signals. Also, memory controller 100 may supply a matching signal MS and chip IDs CID for controlling the refresh operation of semiconductor memory devices 200_1 to 200__*n* in memory module 2200*a* to memory module 2200*a*. Register REG buffers the received control signals, such as command CMD, address ADD, chip IDs CID, and matching signal MS, and supplies the buffered control signals to each of semiconductor memory devices 200_1 to 200__*n*. Also, the PLL receives clock signals CLK, controls phases of clock signals CLK, and supplies clock signals CLK whose phases are controlled to semiconductor memory devices 200_1 to 200__*n*.

Figure 17:
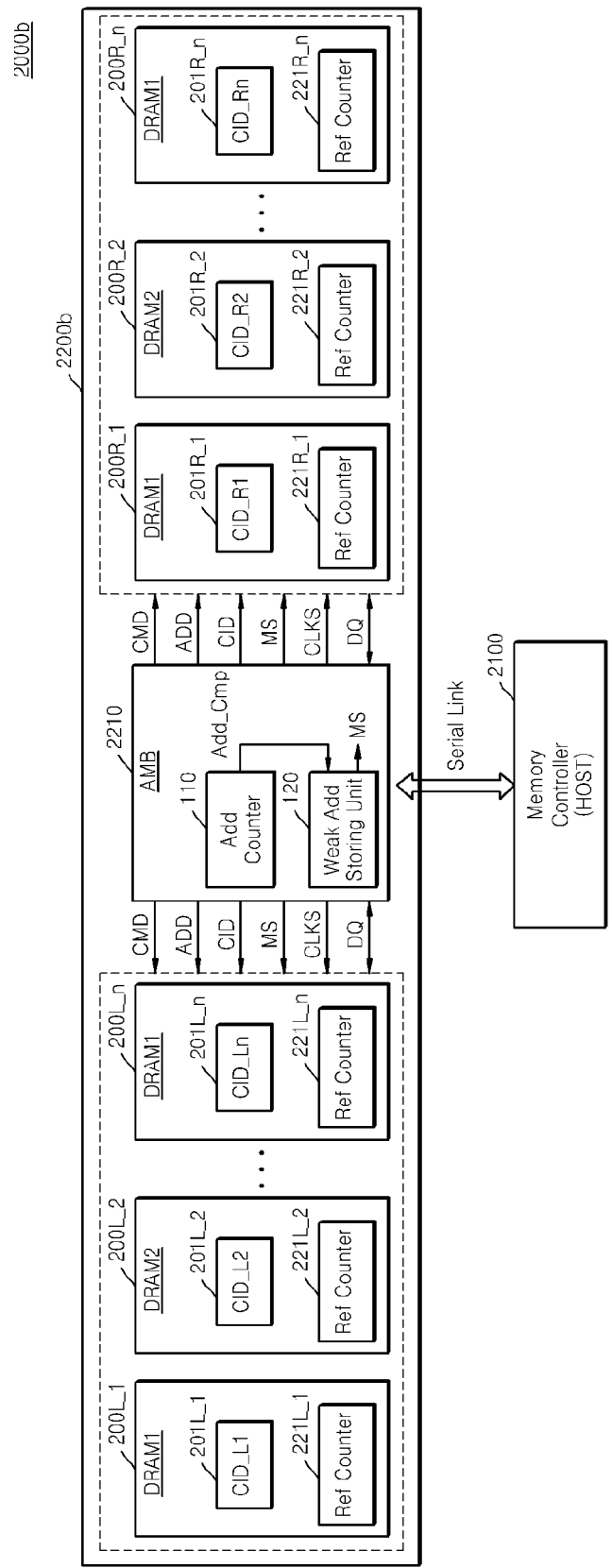
FIG. 17 is a block diagram of a memory system comprising a memory module according to another embodiment of the inventive concept.

FIG. 17 is a block diagram of a memory system 2000*b* comprising a memory module 2200*b* according to another embodiment of the inventive concept. FIG. 17 represents an example in which memory module 2200*b* has the form of fully-buffered DIMM (FBDIMM). As illustrated in FIG. 17, memory system 2000*b* comprises a memory controller 2100 and memory module 2200*b*. Memory module 2200*b* comprises at least one semiconductor memory device 200L_1 to 200L_n and an advanced memory buffer (AMB) chip 2210. In memory module 2200*b* in the form of FBDIMM, memory controller 2100 and AMB chip 2210 in memory module 2200*b* are connected to each other in a point-to-point manner in a serial communication. For convenience, FIG. 17 shows one memory module 2200*b*, but the number of memory modules 2200*b* connected to memory system 2000*b* may be increased so that memory system 2000*b* may have a large capacity. The FBDIMM uses a packet protocol, which can allow high-speed operations.

Various signals for controlling a memory operation are supplied to semiconductor memory devices 200L_1 to 200L_n via AMB chip 2210. AMB chip 2210 transmits and receives data signal DQ to or from semiconductor memory devices 200L_1 to 200L_n and also transmits various addresses ADD and clock signals CLKs to semiconductor memory devices 200L_1 to 200L_n. To manage a refresh operation of semiconductor memory devices 200L_1 to 200L_n, AMB chip 2210 comprises an address counter 110 and a weak address storing unit 120. If an address that is generated by inverting at least one bit of reference address Add_Cmp corresponds to one of the weak addresses stored in weak address storing unit 120, AMB chip 2210 generates a matching signal MS and may supply the refresh command, matching signal MS, and chip ID CIDs of semiconductor memory devices 200L_1 to 200L_n that correspond to the weak addresses to semiconductor memory devices 200L_1 to 200L_n.

In the embodiments of FIGS. 16 and 17, a memory module takes the form of RDIMM or FBDIMM. However, the inventive concept is not limited to these embodiments. For instance, the described concepts can potentially be applied to other types of memory modules, such as a single in-line memory module (SIMM), a dual in-line memory module (DIMM), a small-outline DIMM (SO-DIMM), an unbuffered DIMM (UDIMM), a rank-buffered DIMM (RBDIMM), a mini-DIMM, and a micro-DIMM.

Also, in FIGS. 16 and 17, signal transmission between a memory controller and a memory module and signal transmission between a semiconductor memory device in the memory module and a memory management chip have been performed via a conductive line. However, the inventive concept is not limited thereto. For example, in alternative embodiments, signal transmission between the memory controller and the memory module, signal transmission between the semiconductor memory device and the memory management chip, or signal transmission between a plurality of semiconductor memory devices may be performed by an optical input/output (IO) connection. For example, signals may be transmitted or received by using a radiative method using radio frequency (RF) waves or ultrasonic waves, an inductive coupling method using magnetic induction, or a non-radiative method using magnetic resonance.

The radiative method is a method by which signal transmission is performed in a wireless manner by using an antenna, such as a monopole or a planar inverted-F antenna (PIFA). Radiation is performed while an electronic field or a magnetic field that varies according to time affects each other, and if antennas having the same frequency are present, a signal may be received according to polarization characteristics of an incident wave. The inductive coupling method is a method by which a strong magnetic field is generated in one direction by winding coils several times and coils that are resonant at similar frequencies come close to each other to induce coupling. The non-radiative method uses evanescent wave coupling that moves an electronic wave between two mediums that are resonant at the same frequency via a near electronic field.

Figure 18:
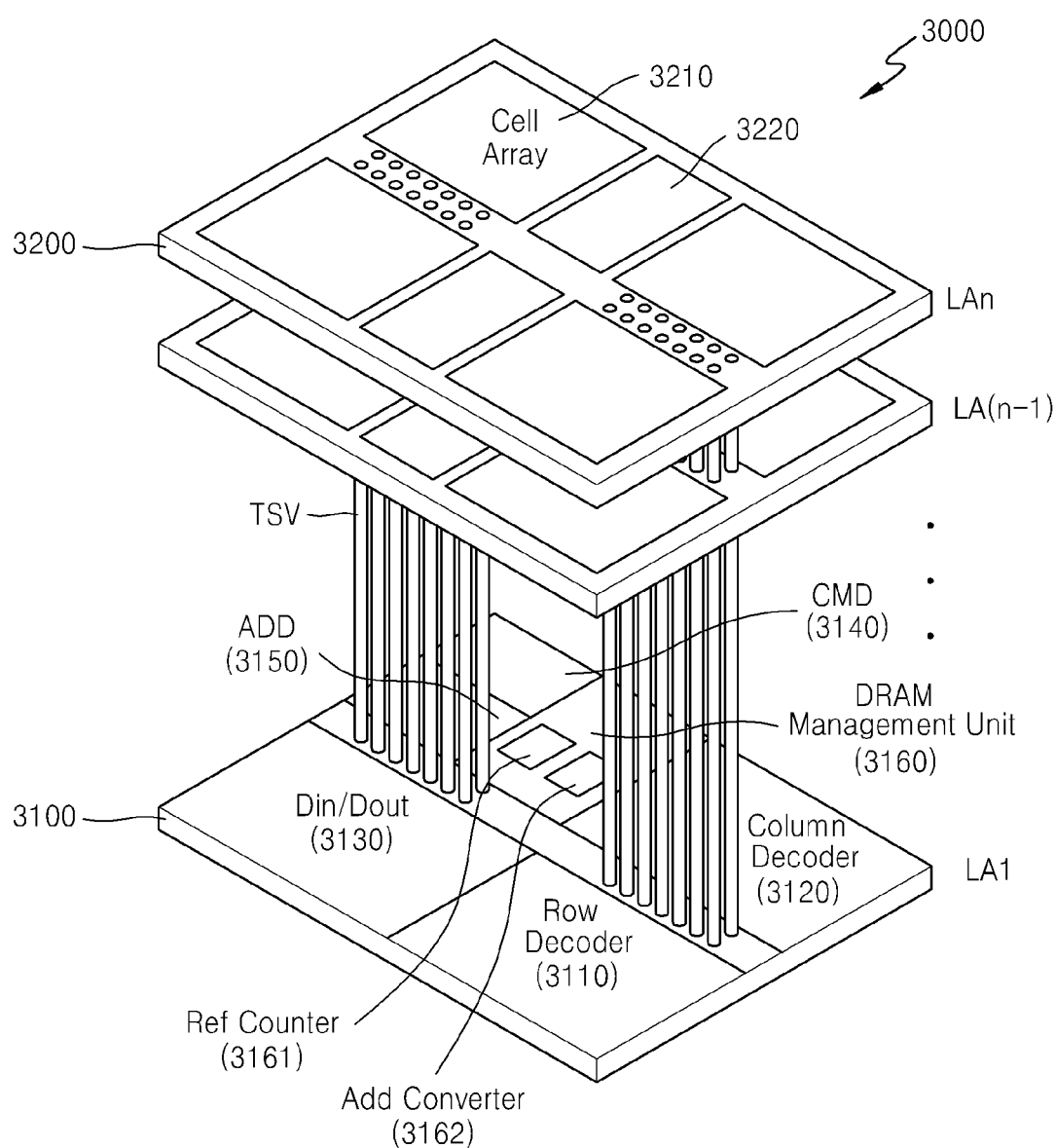
FIG. 18 illustrates a structure of a semiconductor memory device according to another embodiment of the inventive concept.

FIG. 18 illustrates a structure of a semiconductor memory device 3000 according to another embodiment of the inventive concept. As illustrated in FIG. 18, semiconductor memory device 3000 comprises a plurality of semiconductor layers LA1 to LAn. Each of semiconductor layers LA1 to LAn may be a memory chip comprising a DRAM cell, and some of semiconductor layers LA1 to LAn may be master chips that interface with an external controller, and the others may be slave chips that store data. In FIG. 18, it is assumed that the lowermost semiconductor layer LA1 of semiconductor memory device 3000 is a master chip and the other semiconductor layers LA2 to LAn are slave chips.

Semiconductor layers LA1 to LAn transmit and receive signals via through silicon vias (TSVs), and semiconductor layer LA1 as the master chip communicates with an external memory controller (not shown) via a conduction unit (not shown) formed on an outer surface of semiconductor memory device 3000. A configuration and operation of semiconductor memory device 3000 will now be described below based on a first semiconductor layer 3100 as a master chip and an n-th semiconductor layer 3200 as a slave chip.

First semiconductor layer 3100 comprises various circuits that drive a cell array 3210 disposed on the slave chip. For example, first semiconductor layer 3100 may comprise a row decoder X-Dec 3110 that drives wordlines of cell array 3210, a column decoder Y-Dec 3120 that drives bitlines, a data input/output unit 3130 for controlling input/output of data, a command buffer 3140 that receives a command CMD from an external device, and an address buffer 3150 that receives an address from the external device and buffers the address.

Also, first semiconductor layer 3100 may further comprise a DRAM management unit 3160 that manages a memory operation of the slave chip. DRAM management unit 3160 do-not-care processes or does not do-not-care process at least one bit of a counting address based on a received matching signal, as described above in the aforementioned embodiments so that a frequency at which refresh is selectively performed on weak rows may be increased. To this end, DRAM management unit 3160 comprises a refresh counter 3161 and an address converter 3162.

The n-th semiconductor layer 3200 comprises cell array 3210 and other peripheral circuits driving cell array 3210, for example, a peripheral circuit region 3220 in which a row/column selection unit (not shown) for selecting rows or columns of cell array 3210 and a bitline sense amplifier (not shown) are disposed.

Figure 19:
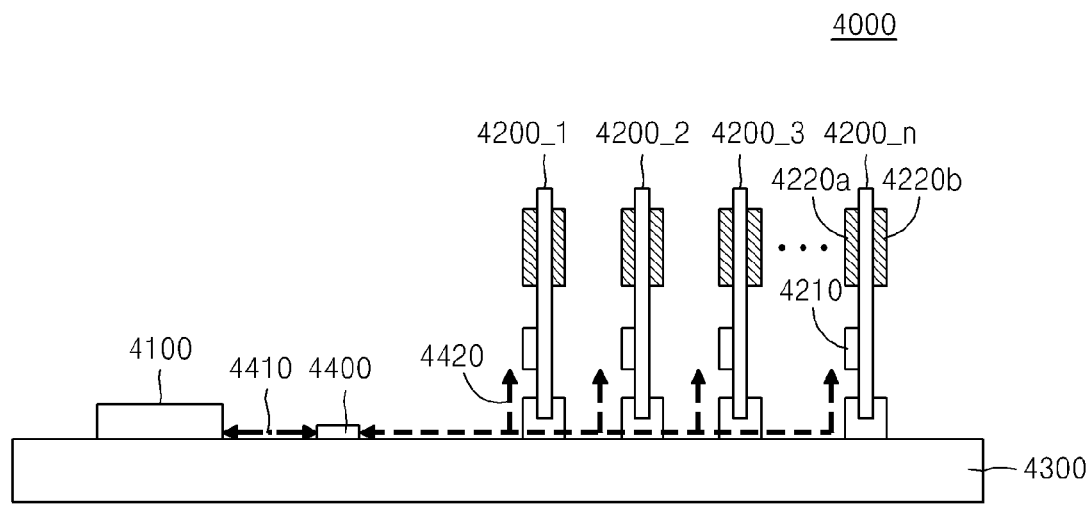
FIG. 19 illustrates a structure of a server system comprising the semiconductor memory device of FIG. 1 or 13.

FIG. 19 illustrates a structure of a server system 4000 comprising semiconductor memory device 200 or 200_1 illustrated in FIG. 1 or 13.

Server system 4000 comprises a memory controller 4100 and a plurality of memory modules 4200_1 to 4200_n. Each of memory modules 4200_1 to 4200_n comprises memory blocks 4220a and 4220b comprising a plurality of memory chips. For example, the memory chips that constitute memory blocks 4220a and 4220b may be DRAM chips. However, the inventive concept is not limited thereto, and the memory blocks may comprise volatile or non-volatile memory chips that require periodic refresh.

Memory controller 4100 and memory modules 4200_1 to 4200_n may be a memory controller and a memory module according to the above-described embodiments. Thus, memory chips in memory modules 4200_1 to 4200_n may increase a refresh frequency of weak addresses based on a matching signal received from memory controller 4100. Alternatively, each of memory modules 4200_1 to 4200_n may comprise a memory management chip, and each memory chip may perform refresh by receiving the matching signal from the memory management chip.

In FIG. 19, server system 400 has a single channel structure in which memory controller 4100 and memory modules 4200_1 to 4200_n are mounted on a same circuit board 4300. However, the inventive concept is not limited to this embodiment. For instance, server system 4000 may be designed in various structures comprising a multi-channel structure in which sub-substrates on which a plurality of memory modules are mounted, are combined with sockets of a main substrate on which memory controller 4100 is mounted.

Signal transmission of memory modules 4200_1 to 4200_n may be performed by an optical IO connection. Server system 4100 may further comprise an electrical to optical conversion unit 4400, and each of memory modules 4200_1 to 4200_n may further comprise an optical to electrical conversion unit 4210. Also, according to another embodiment, electrical to optical conversion unit 4400 may be embedded in memory controller 4100.

Memory controller 4100 is connected to electrical to optical conversion unit 4400 via an electric channel 4410. Thus, memory controller 4100 may transmit or receive signals to or from electrical to optical conversion unit 4400 via electric channel 4410.

Electrical to optical conversion unit 4400 performs signal processing of converting an electric signal received from memory controller 4100 into an optical signal to transmit the optical signal to an optical channel 4420 and converting the optical signal received from optical channel 4420 into an electric signal to transmit electric signal to electric channel 4410.

Memory modules 4200_1 to 4200_n are connected to electrical to optical conversion unit 4400 via optical channel 4420. The optical signal transmitted via optical channel 4420 is applied to optical to electrical conversion unit 4210 in each of memory modules 4200_1 to 4200_n. Optical to electrical conversion unit 4420 converts the optical signal into the electrical signal to transmit the electrical signal to each of memory blocks 4420a and 4420b. Also, electrical signals generated in memory blocks 4420a and 4420b are converted into optical signals by using optical to electrical conversion unit 4210, and the optical signals are output.

As described above, in server system 4000, signal transmission between memory controller 4100 and memory modules 4420a and 4420b may be performed via optical channel 4420 in an optical IO manner.

Figure 20:
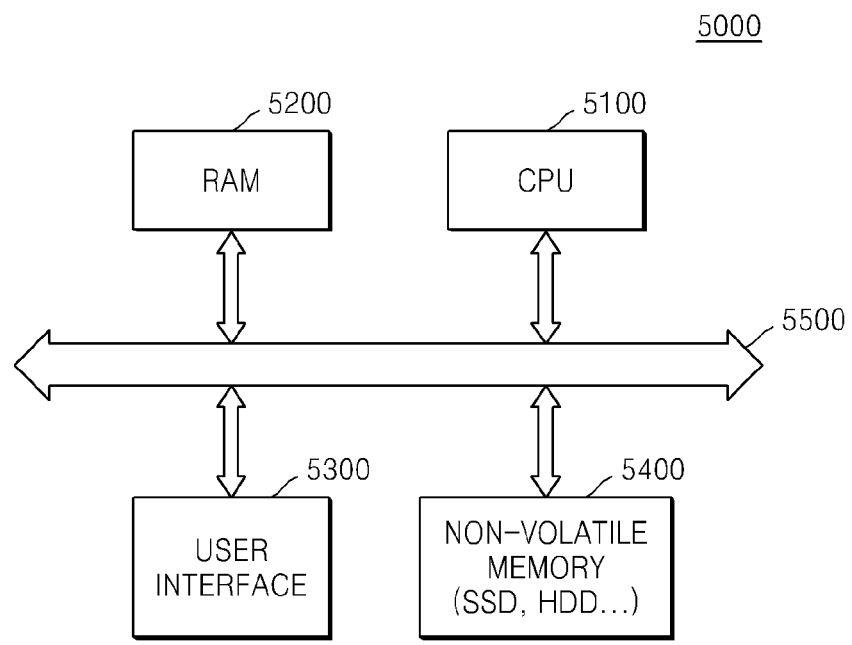
FIG. 20 is a block diagram of a computing system comprising the memory system illustrated in FIG. 1, 13, 15, 16, or 17, according to an embodiment of the inventive concept.

FIG. 20 is a block diagram of a computing system 5000 comprising the memory system illustrated in FIG. 1, 13, 15, 16, or 17, according to an embodiment of the inventive concept. A semiconductor memory device may be mounted as RAM 5200 on an information processing system, such as a mobile device or a desktop computer. The semiconductor memory device mounted as RAM 5200 according to one of the above-described embodiments may be used. For example, the semiconductor memory device or a memory module according to the above-described embodiments may be used as RAM 5200. Also, RAM 5200 of FIG. 20 may be included in a system comprising both a memory device and a memory controller.

Computing system 5000 comprises a central processing unit (CPU) 5100, RAM 5200, a user interface 5300, and non-volatile memory 5400. Each of these elements is electrically connected to a bus 5500. The non-volatile memory 5400 may be a large-capacity storage device, such as a solid-state drive (SSD) or a hard disk drive (HDD).

In computing system 5000, as in certain other embodiments, RAM 5200 comprises a DRAM chip (not shown) comprising a DRAM cell for storing data, and a configuration for performing refresh according to an embodiment of the inventive concept is disposed in the DRAM chip. For example, a configuration for increasing a refresh frequency on weak addresses from a controller is disposed in the DRAM chip disposed on RAM 5200. Thus, an error may be prevented from occurring in data stored in the DRAM chip, and data having improved reliability may be transmitted to the DRAM chip and may be used in an operation of computing system 5000.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A semiconductor memory device connected to a memory controller, the semiconductor memory device comprising:
   a cell array comprising a plurality of cell regions;
   a row decoder configured to drive rows corresponding to cell regions in which a refresh operation is to be performed, based on a counting address; and
   a refresh address generator configured to generate the counting address and a modified address as a refresh address in response to a control signal provided from the memory controller, wherein the modified address is generated by inverting at least one bit of the counting address, and wherein the semiconductor memory device performs concurrent refresh operations on a first cell region corresponding to the counting address and a second cell region corresponding to the modified address where the second cell region is determined to have weak cells,
   wherein the refresh address indicates that a refresh operation is to be performed on only the first cell region where the control signal is in a first logic state, and the refresh address indicates that a refresh operation is to be performed on both the first and second cell regions where the control signal is in a second logic state.

2. The semiconductor memory device of claim 1, wherein the refresh address generator generates the refresh address by do-not-care processing at least one bit of the counting address in response to the control signal.

3. The semiconductor memory device of claim 1, wherein the at least one bit comprises a most significant bit (MSB) of the counting address.

4. The semiconductor memory device of claim 1, wherein the control signal is a matching signal generated by the memory controller that indicates whether the modified address corresponds to one of multiple addresses that are stored in the memory controller and that correspond to weak cell regions.

5. The semiconductor memory device of claim 1, wherein the refresh address generator comprises:
   a refresh counter generating the counting address; and
   an address converter performing do-not-care processing or non-do-not-care processing on at least one bit of the counting address in response to the control signal.

6. The semiconductor memory device of claim 1, wherein the control signal is received via an additional port or at least one address pin of the semiconductor memory device.

7. The semiconductor memory device of claim 1, further comprising a register storing a chip identification (ID), wherein, if the chip ID stored in the register is matched to a received chip ID, the semiconductor memory device refreshes the at least two cell regions.

8. A memory system comprising a memory controller configured to control a refresh operation of a cell array in a semiconductor memory device, wherein the memory controller comprises:
   a weak address storing unit storing addresses of weak cell regions of the cell array;
   an address counter configured to generate a reference address indicating a cell region to be refreshed; and
   a comparator configured to compare a modified address derived from the reference address with the addresses of the weak cell regions and to output a matching signal according to a result of comparison,
   wherein the semiconductor memory device comprises
   the cell array,
   a row decoder configured to select a refresh row based on a received address,
   a refresh counter configured to generate a counting address designating one cell region on which a refresh operation is to be performed, and
   an address converter configured to invert at least one bit of the counting address in response to the matching signal output by the memory controller and to generate a refresh address for refreshing at least two cell regions together, wherein the at least two cell regions comprise a first cell region corresponding to the counting address and a second cell region corresponding to the modified address.

9. The memory system of claim 8, wherein the modified address is generated by inverting at least one bit of the reference address, and if a weak address that is the same as the modified address is among the stored addresses of the weak cell regions, the comparator activates the matching signal.

10. The memory system of claim 9, wherein the at least one bit of the reference address is a most significant bit (MSB) of the reference address.

11. The memory system of claim 8, wherein the address counter and the refresh counter operate in synchronization with each other.

12. The memory system of claim 8, further comprising a plurality of semiconductor memory devices storing data, wherein the memory controller supplies the matching signal and a chip identification (ID) designating a semiconductor memory device in which a weak cell region matched to the reference address is included, to each of the semiconductor memory devices.

13. The memory system of claim 12, wherein the memory controller is disposed on a buffer chip that receives and buffers a command, an address, and data and transmits the buffered command, the address, and the data to the semiconductor memory devices.

14. A method of operating a semiconductor memory device, the semiconductor memory device connected to a memory controller, the method comprising:
generating a refresh address corresponding to a first cell region to be refreshed;
generating a modified address in the semiconductor memory device by inverting at least one bit of the refresh address responsive to a control signal provided by the memory controller, the modified address corresponding to a second cell region different from the first cell region;
determining whether the second cell region comprises weak cells; and
upon determining that the second cell region comprises weak cells, performing concurrent refresh operations on the first and second cell regions.

15. The method of claim 14, wherein said determining whether the second cell region comprises weak cells comprises comparing the modified address with one or more addresses associated with weak cell regions.

16. The method of claim 14, wherein the at least one bit comprises a most significant bit (MSB) of the refresh address.

17. The method of claim 14, wherein the refresh address corresponds to a counting address used to sequentially refresh a plurality of cell regions.

18. The method of claim 14, further comprising, upon determining that the second cell region does not comprise weak cells, performing a refresh operation on the first cell region and not the second cell region.

* * * * *